United States Patent
Ariyoshi et al.

(10) Patent No.: US 6,710,415 B2
(45) Date of Patent: Mar. 23, 2004

(54) SEMICONDUCTOR INTEGRATED CIRCUIT HAVING ANTI-FUSE, METHOD OF FABRICATING, AND METHOD OF WRITING DATA IN THE SAME

(75) Inventors: Ryuji Ariyoshi, Chiba (JP); Isamu Kuno, Chiba (JP); Takahito Fukushima, Chiba (JP); Junji Aoike, Chiba (JP)

(73) Assignee: Kawasaki Microelectronics, Inc., Chiba (JP)

( * ) Notice: Subject to any disclaimer, the term of this patent is extended or adjusted under 35 U.S.C. 154(b) by 0 days.

(21) Appl. No.: 10/461,494

(22) Filed: Jun. 16, 2003

(65) Prior Publication Data

US 2003/0214014 A1 Nov. 20, 2003

Related U.S. Application Data

(63) Continuation of application No. 10/076,652, filed on Feb. 19, 2002, now Pat. No. 6,606,355.

(30) Foreign Application Priority Data

| Feb. 19, 2001 | (JP) | ......................................... 2001-41795 |
| Feb. 19, 2001 | (JP) | ......................................... 2001-41796 |
| Feb. 19, 2001 | (JP) | ......................................... 2001-41797 |

(51) Int. Cl.$^7$ ............................................. H01L 29/76
(52) U.S. Cl. ...................................................... 257/392
(58) Field of Search ........................................ 257/392

(56) References Cited

U.S. PATENT DOCUMENTS

| 4,449,158 A | 5/1984 | Taira |
| 5,019,878 A | 5/1991 | Yang et al. |
| 5,163,180 A | 11/1992 | Eltoukhy et al. |
| 5,257,222 A | 10/1993 | Lee |
| 5,301,159 A | 4/1994 | Lee |
| 5,646,438 A | 7/1997 | Frerichs |
| 5,672,994 A | 9/1997 | Au et al. |
| 5,748,025 A | 5/1998 | Ng et al. |
| 5,973,380 A | * 10/1999 | Cutter et al. ................. 257/530 |
| 6,034,890 A | 3/2000 | Satoh |
| 6,043,538 A | 3/2000 | Allen et al. |
| 6,417,825 B1 | 7/2002 | Stewart et al. |

* cited by examiner

*Primary Examiner*—Allan R. Wilson
(74) *Attorney, Agent, or Firm*—Oliff & Berridge, PLC

(57) ABSTRACT

A semiconductor integrated contains a first MOS transistor of a first conductivity type formed on a surface of a semiconductor substrate, and a second MOS transistor of the first conductivity type having a drain-source breakdown voltage lower than that of the first MOS transistor. The second MOS transistor is used as an anti-fuse, which can be changed to a conductive state with a low writing voltage that does not damage the first MOS transistor. The second MOS transistor is fabricated such that a concentration of a second conductivity type impurity in at least a portion of the channel region adjacent to the drain region is higher than that in a corresponding portion of the first MOS transistor.

14 Claims, 11 Drawing Sheets

SEMICONDUCTOR INTEGRATED CIRCUIT HAVING ANTI-FUSE, METHOD OF FABRICATING, AND METHOD OF WRITING DATA IN THE SAME

This is a Continuation Application of U.S. application Ser. No. 10/076,652 filed on Feb. 19, 2002 now U.S. Pat. No. 6,608,355, the contents of which are incorporated here ts entirety.

BACKGROUND OF THE INVENTION

1. Field of Invention

This invention relates to semiconductor integrated circuits that can achieve desired operations by writing data within it after the completion of the fabrication process. This invention also relates to methods of fabricating the integrated circuits and writing data into the integrated circuits.

2. Description of Related Art

Recently, programmable semiconductor integrated circuits have become widely used. In these semiconductor integrated circuits, desired circuit operations can be achieved by writing required programming data in the finished products, i.e., products that have already been completed by the fabrication process. These programmable semiconductor integrated circuits are particularly useful for diversified products with limited production amounts.

There are various programming technologies for use in these semiconductor integrated circuits. One example of such programming technology uses so-called anti-fuses. An anti-fuse is a device that changes from a non-conductive state to a conductive state in response to certain catalysts such as an application of a voltage higher than the normal operating voltage.

For example, a MOS transistor can be used as an anti-fuse such as shown in U.S. Pat. Nos. 5,019,878 and 5,673,994, hereby incorporated by reference in their entireties. For example, U.S. Pat. No. 5,019,878 discloses a method to make an N-channel MOS (hereinafter referred to as an "NMOS") transistor conductive by applying a programming voltage from the drain region to the source region of the NMOS transistor to form a melt filament across the channel region.

A diode including a PN junction can also be used as an anti-fuse such as shown in U.S. Pat. No. 4,646,427 hereby incorporated by reference in its entirety. This prior art reference discloses a method of making a diode conductive by applying a high reverse voltage to form a bridging metal link that shorts out the diode.

When these technologies are applied to actual use, a high voltage of 10 V or greater is necessary to make the anti-fuse conductive.

In order to write data to an NMOS transistor or a diode functioning as an anti-fuse, a writing circuit for supplying the high voltage (writing voltage) is necessary. Generally, the writing circuit is constructed with MOS transistors that are fabricated along with the NMOS transistor or the diode functioning as the anti-fuse on the same semiconductor substrate. When writing programming data, the writing voltage is also supplied to the writing circuit. As a result, the MOS transistor forming the writing circuit may be damaged.

U.S. Pat. No. 5,068,696 described above, proposes a method for lowering the required writing voltage by applying an appropriate voltage to the gate of the NMOS transistor simultaneously with the programming voltage to the drain. However, this method requires another power supply for applying the gate voltage in addition to the power supply for supplying the writing voltage, and hence the configuration of the writing circuit becomes more complex.

The technology described in the U.S. Pat. No. 4,646,427 utilizes a diode formed in a polysilicon film, which is known to be effective in lowering the required writing voltage. With this method alone, however, it is difficult to satisfactorily lower the required writing voltage.

SUMMARY OF THE INVENTION

Accordingly, the present invention described in the preferred embodiments provides a semiconductor integrated circuit having an anti-fuse, a method of fabricating the semiconductor integrated circuit, and a method of writing data in the semiconductor integrated circuit, in which the programming data can be written by a simple writing circuit without damaging other elements in the semiconductor integrated circuit.

It is an object of the present invention to provide semiconductor integrated circuit that is able to solve the problems of the above-described conventional technology.

In order to achieved this object, one aspect of the present invention provides a semiconductor integrated circuit including a semiconductor substrate having a surface, a first and second MOS transistors formed on the surface of the semiconductor substrate and a writing circuit integrated on the surface of the semiconductor substrate. Each of the first and the second MOS transistors has a first conductivity type source and drain region and a second conductivity type channel region between the source and drain regions. The first MOS transistor has a first drain-source breakdown voltage and the second MOS transistor has a second drain source breakdown voltage lower than the first drain source breakdown voltage. The writing circuit supplies a writing voltage between the drain and the source regions of the second MOS transistor to make the second MOS transistor conductive.

In an exemplary embodiment, at least a portion of the channel region adjacent to the drain region of the second MOS transistor includes a channel impurity of the second conductivity type with a concentration higher than that at a corresponding portion of the first MOS transistor. Preferably, the channel region of the second MOS transistor extends between two ends along an edge of the drain region and at least one of the portions adjacent to the ends of the channel region includes a channel impurity of the second conductivity type with a first concentration higher than that at a first corresponding portion of the first MOS transistor. Further preferably, a center portion between the ends of the channel region of the second MOS transistor includes the channel impurity with a second concentration higher than that at a second corresponding portion of the first MOS transistor.

According to another aspect of the invention, a method of fabricating a semiconductor integrated circuit including a first and second MOS transistor and a writing circuit that supplies a writing voltage to the second MOS transistor is provided. The fabrication method includes forming the first and second MOS transistors on a surface of a semiconductor substrate. Each of the first and second MOS transistors has a first conductivity type source and drain region and a second conductivity type channel region between the source and drain regions. The first MOS transistor has a first drain source breakdown voltage and the second MOS transistor has a second drain source breakdown voltage lower than the first drain-source breakdown voltage. The second drain source breakdown voltage being sufficiently low so that the second MOS transistor becomes conductive when the writing circuit supplies the writing voltage between the drain and the source regions of the second MOS transistor.

In an exemplary embodiment, the method also includes forming the first and the second MOS transistors such that at least a portion of the channel region adjacent to the drain region of the second MOS transistor includes a channel impurity of the second conductivity type with a concentration higher than that at a corresponding portion of the first MOS transistor. Preferably, the first and the second MOS transistors are formed by selectively implanting the channel impurity in at least a portion of a second surface area of the semiconductor substrate without implanting the channel impurity in a corresponding portion of a first surface area. The second surface area surrounds a second surface region of the semiconductor substrate that will become a second active region including the source, drain, and channel regions of the second MOS transistor. The first surface area surrounds a first surface region of the semiconductor substrate that will become a first active region including the source, drain, and channel regions of the first MOS transistor.

According to another aspect of the invention, a method of writing data in a semiconductor integrated circuit is provided. The method includes providing a first and second MOS transistor on a surface of a semiconductor substrate. Each of the first and second MOS transistors has a first conductivity type source and drain region and a second conductivity type channel region between the source and drain regions. The first MOS transistor has a first drain-source breakdown voltage and the second MOS transistor has a second drain-source breakdown voltage lower than the first drain-source breakdown voltage. The method further includes writing the data by supplying a writing voltage between the drain and the source regions of the second MOS transistor to make the second MOS transistor conductive.

According to another aspect of the invention, a programmed semiconductor integrated circuit including a semiconductor substrate having a surface, and a first plurality of first MOS transistors and a second plurality of second MOS transistors formed on the surface of the semiconductor substrate is provided. Each of the first and second MOS transistors has a first conductivity type source and drain region and a second conductivity type channel region between the source and drain regions. The first MOS transistors have a first drain-source breakdown voltage and the second MOS transistors have a second drain-source breakdown voltage lower than the first drain-source breakdown voltage. Conductive filaments that connect between respective source and drain regions are formed in selected ones of the second MOS transistors.

DETAILED DESCRIPTION OF PREFERRED EMBODIMENTS

This invention was first described in Japanese Patent Application Nos. 2001-41795, 2001-41796, and 2001-41797, hereby incorporated by their entireties.

Embodiments of semiconductor integrated circuits, methods of fabricating the semiconductor integrated circuits and methods of writing data in the semiconductor integrated circuits according to this invention are described below.

A first embodiment will be explained referring to FIGS. 1 to 5. The first embodiment utilizes an NMOS transistor as an anti-fuse.

Figure 1:
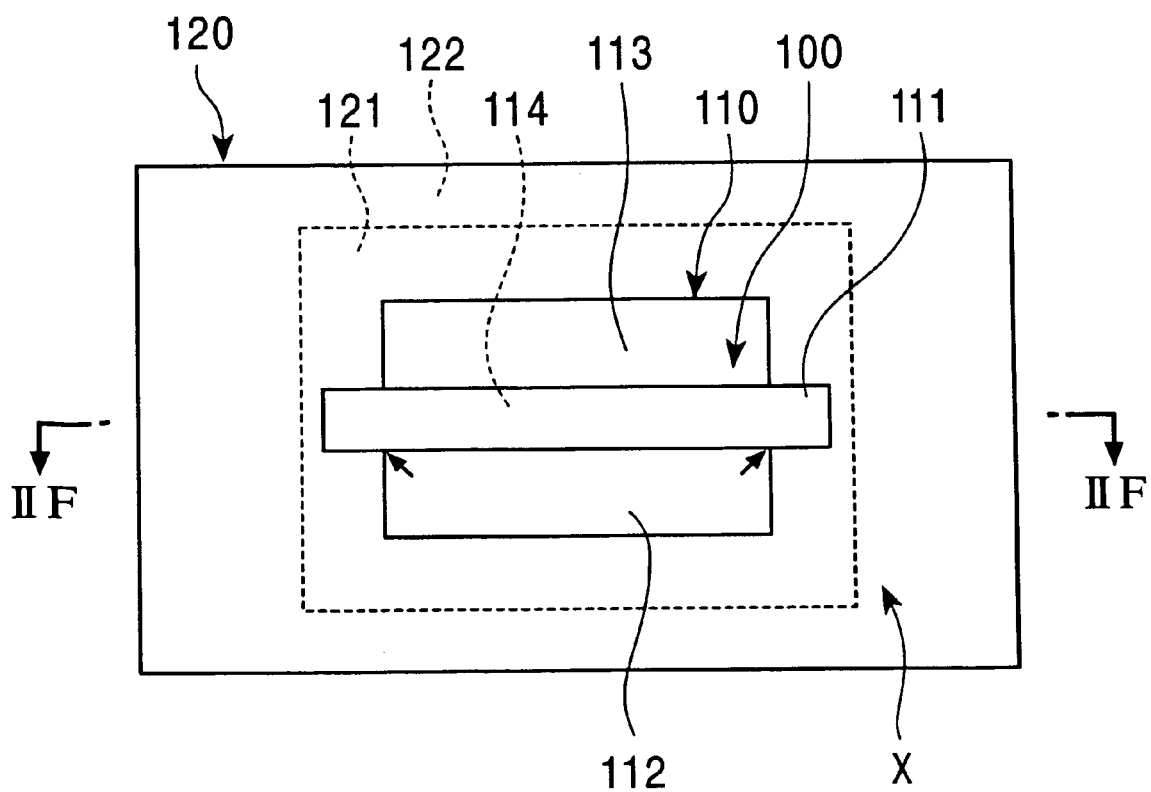
FIG. 1 is a top view of an NMOS transistor included in a semiconductor integrated circuit according to a first embodiment of this invention.

FIG. 1 shows a top view of an NMOS transistor included in the semiconductor integrated circuit according to the first embodiment.

An NMOS transistor 100 shown in FIG. 1 is formed in an active region 110 formed on the surface of a p-type semiconductor substrate or in a p-well region on the surface of a p-type or n-type semiconductor substrate. A gate electrode 111 is formed over a portion of the active region 110 with a gate insulating film between them and extends in a horizontal direction on the substrate. The portion of the active region 110 under the gate electrode 111 forms a channel region 114 of the NMOS transistor. At both sides of the channel region 114 (both lower and upper sides in FIG. 1), an n-type drain diffusion region 112 and an n-type source diffusion region 113 is formed, respectively. A PN junction is formed between the p-type channel region 114 and each of the n-type drain region 112 and the source region 113.

As shown in FIG. 1, the drain and source regions 112 and 113 bound the upper and the lower sides of the channel region 114. While the isolation region X bounds the left and right sides of the channel region 114. Typically, the "width" of the channel of the NMOS transistor 100, i.e., the dimension of the channel region 114 between two ends bounded by the isolation region X, or the dimension of the channel region 114 in the horizontal direction in FIG. 1, is 2 to 8 $\mu$m. The typical "length" of the gate of the NMOS transistor 100, i.e., the dimension of the gate electrode 111 perpendicular to the boundary between the source and the channel regions or between the drain and the channel regions, or in the vertical direction in FIG. 1, is 1 $\mu$m.

The isolation region X is formed around the active region 110 to isolate the active region 110 from other transistors and elements on the surface of the semiconductor substrate. A field insulation film is formed on the surface of the isolation region X by, for example, a local oxidation of silicon (LOCOS) process. In a semiconductor region that is in contact with the bottom surface of the field insulation film, an n-channel stopper region 120 to which a p-type impurity is doped is formed.

The n-channel stopper region 120 is formed with a high concentration region 121 which is in direct contact with the periphery of the active region 110 and a low concentration region 122 which is connected to the outside of the high concentration region 121. The high concentration region 121 is doped with the p-type impurity at a concentration higher than the low concentration region 122.

The semiconductor integrated circuit according to the first embodiment contains a large number of NMOS transistors. When the semiconductor integrated circuit is a complementary MOS (CMOS)-type, it contains many NMOS transistors and many p-type MOS (PMOS) transistors which have a conductivity type opposite to the NMOS transistors.

There are two types of NMOS transistors in the semiconductor integrated circuit according to the first embodiment. The first type of NMOS transistors (higher breakdown voltage NMOS transistors), which are used to form a writing circuit and other circuits in the semiconductor integrated circuit, have a relatively high drain-source breakdown voltage of approximately 15 V. The second type of NMOS transistors (lower breakdown voltage transistors), which are used as anti-fuses, have a relatively low drain-source breakdown voltage of approximately 10 V or smaller. Both types of NMOS transistors have almost the same structure.

However, only the second NMOS has the high concentration region 121 in the n-channel stopper region 120. The high concentration region 121 makes the p-type impurity concentration, at portions near the both ends in the width direction (horizontal direction of the drawing) of the channel region 114 of the second NMOS transistor, higher than the concentration at the corresponding portion of the first NMOS transistor. As a result, the breakdown voltage of the second NOMS transistor is lower than the breakdown voltage of the first NMOS transistor.

Referring to FIGS. 2A to 2F, a method of fabricating the NMOS transistor shown in FIG. 1 will now be described.

FIGS. 2A to 2F are sectional views showing a step-by-step process of fabricating the NMOS transistor 100 shown in FIG. 1. Specifically, the method of fabricating the lower breakdown voltage NMOS transistor is described. The method of fabricating the higher breakdown voltage NMOS transistor is substantially the same.

The NMOS transistor is formed on a surface of a p-type semiconductor substrate or, if the semiconductor integrated circuit is the CMOS-type, in a p-well region on the surface of a p-type or an n-type semiconductor substrate. The NMOS transistor 100 shown in FIG. 1 is formed in a p-well region.

Figure 2A:
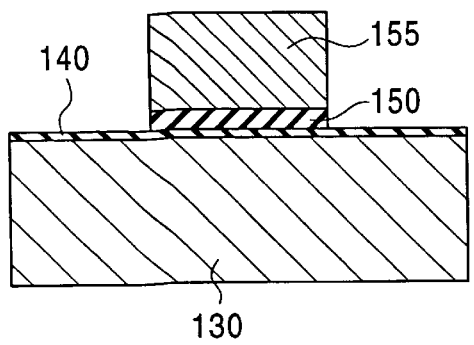
FIGS. 2A to 2F are illustrations showing a step-by-step process for fabricating the NMOS transistor shown in FIG. 1.

The p-well 130 shown in FIG. 2A is formed by an implantation of boron ions into a portion of the surface of the p-type semiconductor substrate and by a subsequent drive-in diffusion. The acceleration energy and the dose of the boron ion implantation are, for example, 35 keV and $7 \times 10^{12}$ cm$^{-2}$, respectively. The drive-in condition is, for example, approximately 1100° C. for 16 hours.

Next, the surface of the semiconductor substrate is oxidized to form a thin silicon oxide film 140 with a thickness of, for example, 24 nm. On this silicon oxide film 140, a silicon nitride film 150 is deposited using a chemical vapor deposition (CVD) process. The silicon nitride film 150 acts as an oxidation resistant film. The silicon nitride film 150 is deposited onto the entire surface of the oxide film 140 and is patterned in a necessary pattern using a resist mask 155.

Figure 2D:
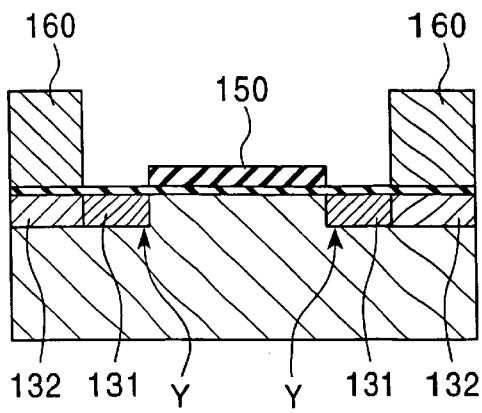
Figure 2B:
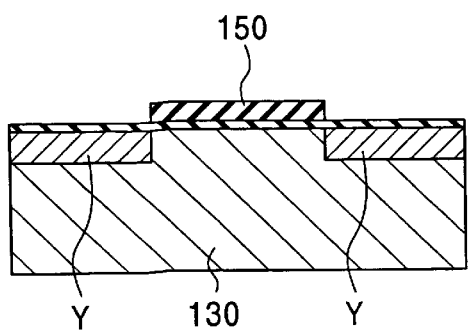
Figure 2E:
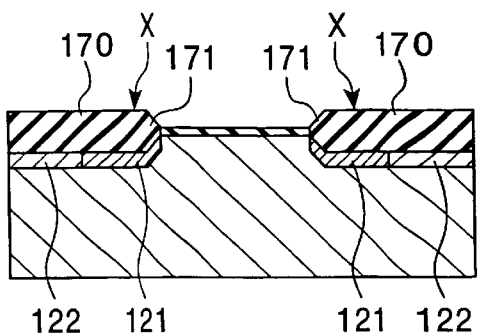
Figure 2C:
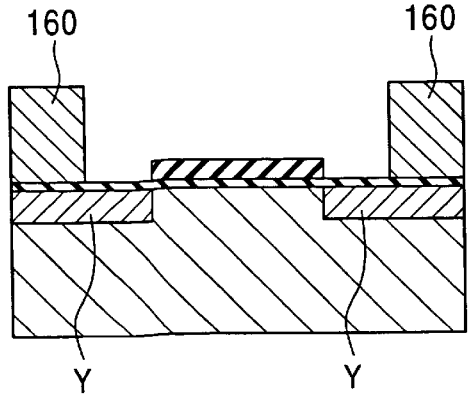
Figure 2F:
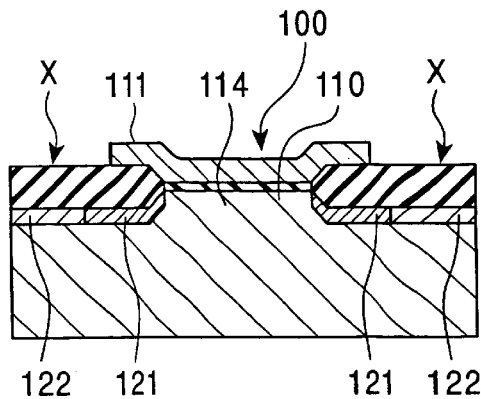

As will be explained later, the pattern of the silicon nitride film 150 determines the location of the active region 110 of the NMOS transistor 100 and the isolation region X surrounding the active region, as shown in FIG. 2F. That is, the surface region of the semiconductor substrate covered by the silicon nitride film 150 will become the active region of the NMOS transistor 100, and the surrounding area will become the isolation region X when the fabrication process is completed.

Next, an n-channel stopper implantation for forming the n-channel stopper region is performed. The n-channel stopper implantation includes two ion implantation steps.

As the first implantation step, a surface portion in the p-well region 130 is implanted with p-type impurity ions, such as boron ions, thus forming an ion-implanted region Y shown in FIG. 2B. The silicon nitride film 150 functions as a mask, and hence boron ion implantation into the surface region of the semiconductor substrate below the silicon nitride film 150 is blocked. Ion implantation is performed to determine a breakdown voltage of the isolation region X. For example, the first ion implantation is performed with an acceleration energy of 40 keV and a dose of $6 \times 10^{13}$ cm$^{-2}$.

The preceding steps are performed in regions for forming both types of the NMOS transistors with the lower and higher drain-source breakdown voltages.

As will be explained later, the first implantation step can be made before or after removing the resist mask 155 used to pattern the silicon nitride film 150. In the latter case, the silicon nitride film should be thick enough to prevent the penetration of the implanted boron ions.

The first implantation step may be skipped. For example, the breakdown voltage of the isolation region X can be made sufficiently high without the first boron implantation if the p-type impurity concentration of the well 130 is sufficiently high.

Referring to FIG. 2C, a resist mask 160 is formed. The resist mask 160 is a mask for separating the ion-implanted region Y into a heavily-doped region and a lightly-doped region. The resist mask 160 has an aperture at the inner side of the ion-implanted region Y. After the resist mask 160 is formed, additional boron ions are implanted with, for example, an acceleration energy of 40 keV and a dose of $1.2 \times 10^{14}$ cm$^{-2}$, as the second implantation step.

In the ion implanted region Y, the inner region which is not covered by the resist mask 160 is doped with boron with a dose of $1.8 \times 10^{14}$ cm$^{-2}$, which is the total of the doses of the first and the second ion-implantation steps. This unmasked region becomes the heavily-doped region 131. On the other hand, the outer region which is masked by resist mask 160 is only doped with boron with the dose of $6 \times 10^{13}$ cm$^{-2}$, which is the dose of the first ion-implantation step. This masked region becomes the lightly-doped region 132. As a result, the ion-implanted region Y, including a heavily-doped region 131 and a lightly-doped region 132, is formed in the surface layer of the p-well 130, as shown in FIG. 2D.

The ion implantation step that forms the heavily-doped region 131 is performed only in areas of the surface of the semiconductor substrate which forms the second-type NMOS transistors. In other words, the second boron ion implantation step for forming the heavily-doped region 131 is performed with resist mask 160 covering the areas forming the higher breakdown voltage NMOS transistors.

After resist mask 160 is removed, the field insulation film 170 is formed on the surface of the semiconductor substrate by, for example, thermal oxidation using the silicon nitride film 150 as an oxidation resistant film. That is, portions of the surface of the semiconductor substrate not covered with the silicon nitride film 150 are selectively oxidized. Next, the nitride film 150 is removed as shown in FIG. 2E.

During the oxidation step, the field insulation film 170 absorbs portions of boron atoms in the implanted region Y. And the remaining portions of the boron atoms diffuse deeper into the semiconductor substrate and form the n-channel stopper region 120 at the bottom of the field insulation film 170. The n-channel stopper region 120 includes the high concentration region 121 and the low concentration region 122 corresponding to the heavily-doped region 131 and the lightly-doped region 132, respectively.

During the oxidation step, oxidants diffuse into portions of the semiconductor substrate under the edge of the silicon nitride film 150, and bird's beaks 171 are formed. The thermal diffusion of boron atoms in the lateral direction during the oxidation causes the high concentration regions 121 to extend to the surface portions of the semiconductor substrate under the bird's beaks 171.

With the foregoing steps, the isolation region X having the field isolation film 170 and the n-channel stopper region 120 is formed.

As explained above, the position of the active region 110 surrounded by the isolation region X is determined by the mask 155 used to pattern the silicon nitride film 150 in FIG. 2A. Since the bird's beaks 171 are formed during the thermal oxidation step, however, the position of the edge of the mask 155 does not exactly coincide with the position of the boundary between the isolation region X and the active region 110.

Subsequently, conventional MOS transistor forming steps including ion implantation for adjusting threshold voltages of the transistors, gate insulating film formation, gate electrode formation, and source/drain diffusion region formation, are performed simultaneously for forming both the lower breakdown voltage NMOS transistor 100 and the higher breakdown voltage NMOS transistor. FIG. 2F is a sectional view of the NMOS transistor 100 shown in FIG. 1 along the line IIF—IIF of FIG. 1. That is, the cross section of the NMOS transistor 100 in the channel-width direction is shown.

As described above, the high concentration region 121 of the n-channel stopper region 120 is only formed around the active region of the lower breakdown voltage NMOS transistor. That is, the openings of the resist-mask 160 are formed only in the areas for forming the lower breakdown voltage NMOS transistors and the boron ions are implanted only in the areas for forming the lower breakdown voltage NMOS transistors. Apart from this difference, the NMOS transistor with the higher drain-source breakdown voltage and the NMOS transistor with the lower drain-source breakdown voltage are formed by the same formation process. As will be described later, forming the high concentration region 121 at a position in contact with the channel region 114 lowers the drain-source breakdown voltage of the lower breakdown voltage NMOS transistor 100.

Subsequently, an interlayer dielectric film for covering the surface of the transistors is formed. Contact holes are formed at appropriate positions in the interlayer dielectric film. Electrodes of the source, drain, gate, and well of the NMOS transistor 100 are formed in the contact holes. Also, interconnections for connecting the transistors and other circuit elements of the semiconductor integrated circuit are formed on the surface of the interlayer dielectric film. The electrodes and interconnections are formed with, for example, an aluminum alloy film.

Consequently, the semiconductor integrated circuit according to the first embodiment is fabricated.

Figure 3:
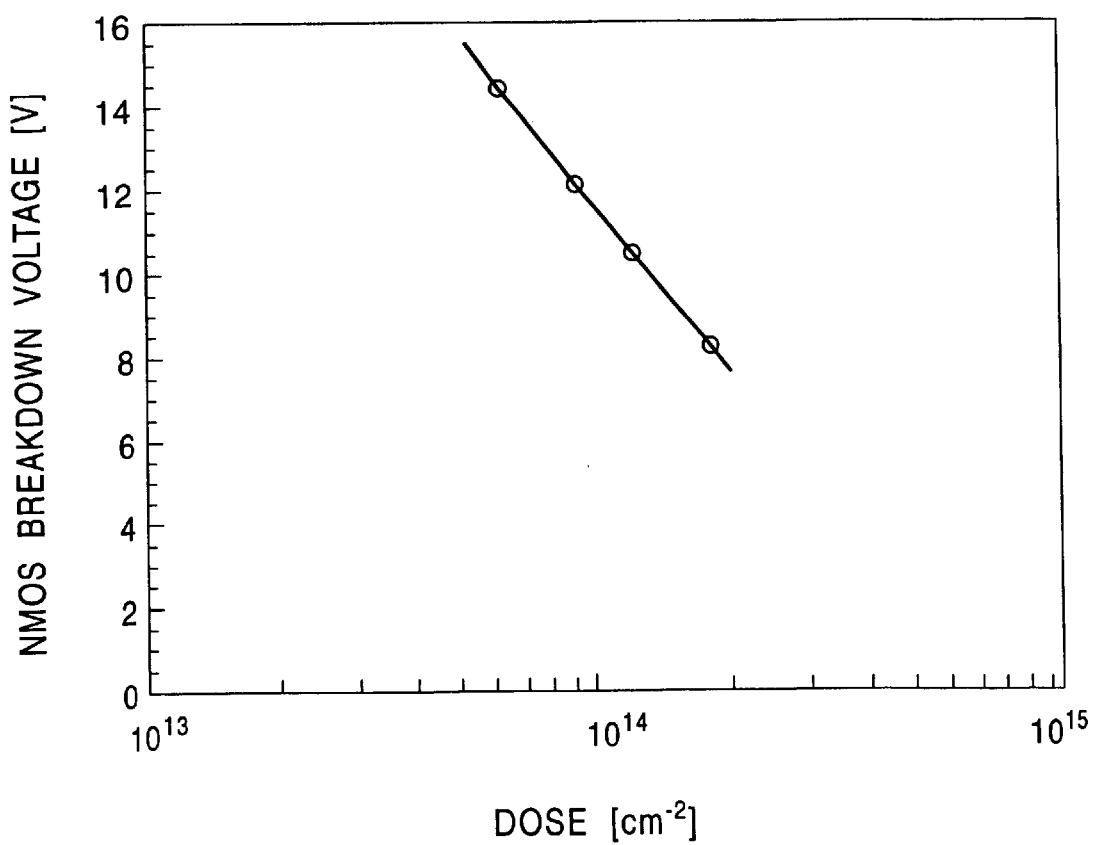
FIG. 3 is a graph showing a relationship between the dose of p-type impurity implanted into the n-channel stopper region and the drain-source breakdown voltage of the NMOS.

Referring to FIG. 3, the relationship between the dose of the boron implantation, for forming the n-channel stopper region 120 and the drain-source breakdown voltage of the NMOS transistor 100 will now be described.

FIG. 3 is a graph showing the relationship between the implantation dose into the heavily-doped region 131 of the implanted region Y and the breakdown voltage between the drain and the source of the NMOS 100 formed by the process shown in FIG. 2.

Referring to FIG. 3, the horizontal axis is a logarithmic axis and represents the total dose ($cm^{-2}$) of boron ions implanted to form the n-channel stopper region 120. The vertical axis represents the drain-source breakdown voltage (V) of the NMOS 100 transistor. The drain-source breakdown voltage is a voltage that can force a current to flow from the drain to the source. The breakdown voltage is measured by applying a gradually increasing positive voltage to the drain while the source, the p-well, and the gate of the NMOS 100 transistor are maintained at a ground potential. As explained in the U.S. Pat. No. 5,068,696, the highest voltage is required when the current starts to flow. The breakdown voltage shown in FIG. 3 is this highest voltage.

After the breakdown voltage is once applied and the NMOS transistor 100 is broken, the NMOS transistor becomes conductive, i.e., has a low resistance between the drain and the source regions, and does not return to the non-conductive state even after the application of the voltage is terminated. The resistance between the drain and the source regions of the broken NMOS transistor does not depend on the gate voltage. That is, the transistor that is made to be conductive by applying the breakdown voltage permanently has a low resistance between the drain and the source regions not relying on the gate voltage.

From the graph shown in FIG. 3, it can be seen that the drain-source breakdown voltage is reduced as the implantation dose increases. For example, the breakdown voltage becomes below 10 V when the dose is $1.3 \times 10^{14}$ $cm^{-2}$ or greater.

In the NMOS transistor 100 surrounded by the high concentration region 121 formed by the fabrication method described in FIG. 2, the dose is the total of the doses in the first and the second implantation steps, and is $1.8 \times 10^{14}$ $cm^{-2}$. Thus, the breakdown voltage of the lower breakdown voltage NMOS transistor 100 is approximately 8 V. In contrast, in the NMOS transistor that does not have the high concentration region 121, the dose that determines the breakdown voltage is the dose for forming the low concentration region 122, i.e., $6 \times 10^{12}$ $cm^{-2}$. Therefore, the breakdown voltage of higher breakdown voltage NMOS transistor is approximately 14 to 15 V.

Accordingly, a semiconductor integrated circuit containing two types of NMOS transistors having significantly different drain-source breakdown voltages can be fabricated by only adding the second ion implantation step together with the step for forming the resist mask 160 to the conventional fabrication process.

In this example, the total dose of the p-type impurity for forming the high concentration region 121 surrounding the lower breakdown voltage NMOS transistor is three times the dose for forming the n-channel stopper region surrounding the higher breakdown voltage NMOS transistor. In order to make a sufficiently large difference between the drain-source breakdown voltages of the two types of NMOS transistors, it is generally preferable to make the ratio of the two doses two or greater, or more preferably, 2.5 or greater.

As explained previously, some portions of p-type impurity atoms implanted in the implanted region Y are absorbed in the field insulation film 170, and only remaining portions of the implanted impurity atoms are diffused to form the n-channel stopper region. The actual p-type impurity concentration in the high concentration and low concentration regions 121 and 122, or the actual ratio of the concentrations in the high concentration and low concentration regions, are not known. Presumably, however, the ratio of the concentrations is approximately the same as the ratio of the implantation doses.

The reason for the reduction in the drain-source breakdown voltage of the NMOS transistor by increasing the implantation dose of the p-type impurity for forming the channel stopper region will now be considered.

When a high voltage is applied between the drain and the source of the NMOS transistor 100, the PN junction between the drain region 112 and the channel region 114 is reverse-biased. A high electric field is also applied to the depletion region of the PN junction between the drain and the channel regions.

Both ends of the channel region bounded by the isolation region X, i.e., the left and right ends in FIG. 1, are adjacent to the channel stopper region 120. As a result, the p-type impurity atoms diffuse into portions of the channel region adjacent to the both ends during the LOCOS oxidation or the subsequent heat treatment steps. The p-type impurity concentration at these portions becomes higher than the p-type dopant concentration in the center portion of the channel region 114. As a result, in the end portions, the width of the depletion region becomes narrower than that in the center portion, and the field intensity increases.

Therefore, the highest field intensity is developed between the drain diffusion region 112 and the end portions of the channel region 114, as indicated by the arrows in FIG. 1. As a result, when a high voltage equal to or higher than the breakdown, voltage is applied to the NMOS transistor 100, a spontaneous breakdown of the PN junction between the drain region 112 and the channel region 114 occurs at either of these two points. Electric current begins to flow at the broken position and the breakdown state is maintained.

By causing the high concentration region 121 to contact the ends of the channel region 114 in the lower breakdown voltage NMOS transistor, the concentration of the p-type impurity in the end portions of channel region increases. As a result, the field intensity at the end portions of the channel region 114 becomes even higher. The breakdown voltage necessary to make the breakdown at the end portions of the channel region 114 also becomes lower.

Therefore, as shown in FIG. 3, the breakdown voltage of the NMOS transistor 100 can be lowered by increasing the p-type impurity implantation dose in the area surrounding the region that is to become the active region 110.

It seems also possible to increase the intensity of the electric field and lower the breakdown voltage by other methods. That is, the p-type impurity concentration at any portion of the channel region adjacent to the drain region can be increased to narrower the depletion layer. Thereby increasing the field intensity. Also, for example, when increasing the p-type impurity concentration of the p-well region, the concentration increases in the entire channel region 114.

However, it is preferable to lower the breakdown voltage by locally increasing the p-type impurity concentration at specific portions of the channel region 114. In the NMOS transistor 100 shown in FIG. 1, the high concentration channel stopper region 121 is provided in contact with the ends of the channel region 114, thus the p-type impurity concentration is locally increased at the end portions of the channel region 114. As a result, the position at which the breakdown occurs can be specified, and the junction breakdown can be initiated at either of these points at a lower voltage with a high reproducibility.

Although the breakdown of the PN junction between the drain region 112 and the channel region 114 initiates at the end portions as indicated by the arrows in FIG. 1, this local breakdown may trigger the breakdown of the PN junction in the center portion.

In a practical example, an electric current of a few tens of milliamperes was caused to flow through the NMOS transistor 100. As a result, the NMOS transistor became conductive with a drain-source resistance of a few tens of ohms measured with a gate voltage of 0V. The resistance was measured after the application of the high voltage was terminated.

This NMOS transistor was examined closely under a microscope. Aluminum, which is a component of the electrode contacting the source region, was observed entering the center portion of the channel region. Specifically, it was observed that the aluminum entered the surface layers of the source region 113, the channel region 114, and the drain region 112 so as to connect contacts of the drain and the source.

This phenomenon can be explained by the following. When an electric current of a few tens of milliamperes flows, the breakdown of the PN junction between the drain diffusion 112 and the end portion of the channel region 114 spreads to the center portion. The aluminum atoms in the metal electrode receive kinetic energy from the flowing electrons, and the aluminum atoms move from the source toward the drain. Thereby a conductive filament containing the metal in the electrode that shorts the source and the drain was formed. Formation of the conductive filament is believed to be effective to lower the resistance between the drain and source of the NMOS transistor 100 that was made to be conductive.

Therefore, it is advantageous to also increase the p-type impurity concentration in the center portion of the channel region 114 of the lower breakdown voltage NMOS transistor. Thereby, the spread of the breakdown to the center portion is facilitated and the conductive filament can be formed at a relatively low current.

To increase the p-type impurity concentration at the center portion of the channel region, for example, the acceleration energy of boron ion implantation for forming the heavily-doped region 131 in FIG. 2D can be increased. Thereby, the boron ions partially penetrate through the silicon nitride film 150 and the silicon oxide film 140, and reach to the surface region of the semiconductor substrate. It is therefore possible to implant portions of ions into the surface region of the semiconductor substrate under the silicon nitride film 150, using the silicon nitride film 150 as a partially transparent mask. The surface region under the silicon nitride film 150 will become the channel region of the lower breakdown voltage NMOS transistor.

Therefore, the p-type impurity concentration in the entire channel region including the center portion of the channel region of the lower breakdown voltage NMOS transistor is increased. In addition to the boron ions-reached to the semiconductor substrate, some of the boron ions reached to the silicon oxide film 140 may diffuse into the semiconductor substrate during the subsequent heat treatments. Note that, in this case, the p-type impurity concentration in the end portions is still higher than that in the center portion due to the diffusion from the high concentration impurity region 121.

In contrast, the energy of the first boron implantation for forming the lightly-doped region 132 can be sufficiently reduced so that the boron ions may not penetrate through the silicon nitride film 150. Thus, the p-type impurity for forming the channel stopper region is not implanted into the surface region of the semiconductor substrate, which is to become the channel region of the higher breakdown voltage NMOS transistor.

As a result, the lower breakdown voltage NMOS has higher p-type impurity concentration at both the ends and center portions of the channel region 114 relative to the concentrations at the corresponding portions of the higher breakdown voltage NMOS transistor.

It is also possible to perform the first boron implantation step with the resist mask 155, which has been used for patterning the silicon nitride film, left on the patterned silicon nitride film 150. The resist mask prevents the penetration of boron ions, even though the implantation energy is high enough to penetrate through the silicon nitride film if the nitride film is not covered with the resist mask. The resist mask 155 is removed before forming the resist mask 160 used for the second boron implantation step. The energy of the second implantation step can be chosen so that a certain amount of boron ions penetrate through the silicon nitride film 150, which is not covered by the resist mask 155.

For example, when the first and the second boron implantation are made at the acceleration energy of 40 keV, the silicon nitride film 150 of 100 nm thick may be used. The projected range of boron ions implanted at the acceleration energy of 40 keV into silicon nitride is 99 nm, which is approximately the same as the thickness of the silicon nitride film 150. Therefore, during the second boron implantation made without the resist mask 155, nearly 50% of the boron ions penetrate through the silicon nitride film 150 and reaches to the underlying thin oxide film 140 or further to the surface region that is to become the channel region 114, if the implantation is made at an angle substantially normal to the surface of the substrate.

On the other hand, the resist mask 160 covering the areas for forming the higher breakdown voltage NMOS transistors blocks the boron ions from penetrating through the silicon nitride film 150. In fact, the data shown in FIG. 3 was obtained with this process. That is, the first boron implantation was made with the resist mask 155 covering the silicon nitride film 150, and the second boron implantation was made with the 100 nm thick silicon nitride film 150 with the acceleration energy of 40 keV. The both implantation steps were made with an angle normal to the surface of the substrate.

In order to effectively increase the p-type impurity concentration at the center portion of the channel region 114, the thickness of the silicon nitride film 150 should be sufficiently small, or the acceleration energy of the boron implantation should be sufficiently high. Thus, significant portions of the implanted boron ions penetrate through the silicon nitride film. For example, the thickness of the silicon nitride film should preferably be not larger than 1.3 times of the projected range of the p-type impurity ions in the silicon nitride film or other films through which the p-type impurity should penetrate, wherein about 20% of the implanted ions penetrate through the silicon nitride or other films. More preferably, the thickness of the silicon nitride film should not be larger than about 1.2 times of the projected range wherein about 30% of the implanted ions penetrate through the silicon nitride film. Most preferably, the thickness of the silicon nitride film should not be larger than about the projected range wherein about 50% of the implanted ions penetrate through the silicon nitride film.

In the method of fabricating described with reference to FIGS. 2A to 2F, p-type impurity is implanted into both channel stopper regions of the higher breakdown voltage and the lower breakdown voltage NMOS transistors with a dose appropriate for the former NMOS transistor. Then, additional p-type impurity is implanted only to the inner portions of the channel stopper regions of the lower breakdown voltage NMOS transistor. Thus, the total dose of the p-type impurity becomes a value appropriate to form the high concentration region 121 surrounding the lower breakdown voltage NMOS transistor. Alternatively, the implantation of p-type impurity into the channel stopper regions surrounding the higher breakdown voltage and the lower breakdown voltage NMOS transistors can be made separated. In this case, p-type impurity ions can be implanted into the channel stopper regions surrounding the lower breakdown voltage NMOS transistors with an appropriate dose by one implantation step.

In the fabrication method described with reference to FIGS. 2A to 2F, the lower breakdown voltage NMOS transistor 100 can be fabricated by adding a step of forming the resist mask 160 (FIG. 2C) and a second boron implantation step (FIG. 2D) to a conventional NMOS transistor fabrication process. In other words, by only adding one resist step and one ion implantation step to a known fabrication method, a semiconductor integrated circuit including the lower breakdown voltage NMOS transistor, which can be desirably used as an anti-fuse, can be fabricated without a significant increase in cost.

Except for the existence of the high concentration region 121 in the lower breakdown voltage NMOS transistor, most of the other structures are common in the two types of NMOS transistors. For example, both types of NMOS transistors are formed in respective surface regions of a semiconductor substrate having the same impurity concentration or in p-well regions having the same impurity concentration. Both types of the NMOS transistor use the gate insulating films formed simultaneously, i.e., gate insulating films with the same thickness and composition. Both types of the NMOS transistors receive the implantation for adjusting the threshold voltages of the NMOS transistors simultaneously, i.e., with the same dose and energy.

However, when the p-type impurity concentration of the center portion of the channel region is increased, the threshold voltage of the lower breakdown voltage NMOS transistor is higher than the threshold voltage of the higher voltage NMOS transistor. In this case, it is possible to conduct the implantation for adjusting the threshold voltage only in the areas for forming the higher breakdown voltage transistors.

As long as a p-type impurity can be introduced selectively into the end portions of the channel region in order to lower the drain-source breakdown voltage, the fabrication method of the first embodiment is not limited to that shown in FIGS. 2A to 2F. For example, the p-type impurity can be implanted using an appropriate mask prior to or subsequent to the implantation for forming the source and the drain diffusion regions.

A semiconductor integrated circuit fabricated according to the first embodiment of this invention will now be described.

Figure 4:
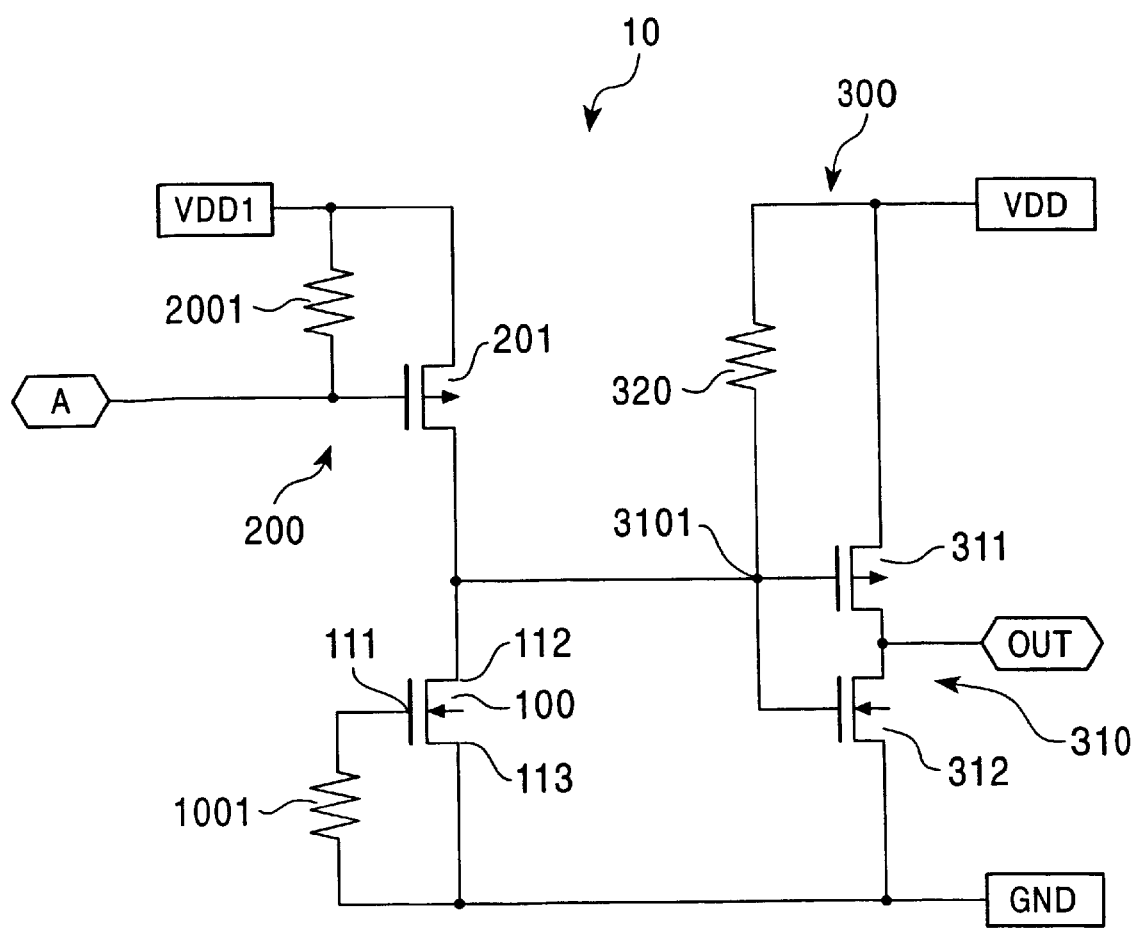
FIG. 4 is a circuit diagram of a one-bit memory circuit.

The semiconductor integrated circuit includes a plurality of one-bit memory circuits, each of which has the lower breakdown voltage NMOS 100 transistor shown in FIG. 1. Referring to FIG. 4, the one-bit memory circuit included in the semiconductor integrated circuit will now be described.

FIG. 4 is a circuit diagram showing the one-bit memory circuit. The memory circuit 10 shown in FIG. 4 includes the lower breakdown voltage NMOS transistor 100, a high-voltage application circuit 200, and a reading circuit 300.

The high-voltage application circuit 200 includes a PMOS transistor 201. The gate of the PMOS transistor 201 is connected to an input terminal A. Data to be written is input to the input terminal A. The source of the PMOS transistor 201 is connected to a VDD1 terminal, and the drain of the PMOS 201 is connected to the drain 112 of the NMOS 100. The VDD1 terminal is connected to an external 10 V writing power supply when writing data into the memory circuit 10. A resistor 2001 for voltage adjustment is provided between the VDD1 terminal and the input terminal A.

The NMOS transistor 100 functions as an anti-fuse in the one-bit memory circuit 10. According to the data input to the input terminal A, the NMOS transistor 100 is broken (written) or unbroken (unwritten) by the high-voltage application circuit 200. The source 112 and the p-well 130 of the NMOS transistor 100 are connected to the ground GND. The gate electrode 111 of the NMOS transistor 100 is also connected to the ground GND through a resistor 1001 for voltage adjustment, and hence the gate 111 of the NMOS transistor 100 is always at an "L" level. Accordingly, the NMOS 100 transistor is always in an OFF state. When the NMOS 100 transistor is not broken, the resistance of the NMOS 100 between the drain and the source terminals is high.

The reading circuit 300 includes an inverter 310. The output of the inverter 310 is connected to an output terminal OUT. The inverter 310 contains a PMOS transistor 311 and an NMOS transistor 312. The gate of the PMOS transistor 311 and the gate of the NMOS transistor 312 are commonly connected to a node 3101. A resistor 320 is connected between a power supply terminal VDD and the node 3101. The resistor 320 has a resistance much lower than the drain-source resistance of the unbroken NMOS transistor 100, that is, the anti-fuse in non-conducting state. At the same time, the resistance of the resistor 320 is much higher than the drain-source resistance of the broken NMOS transistor 100, that is, the anti-fuse in the conducting state. The power supply terminal VDD is connected to a 3.3 V power supply for the reading circuit 300.

Usually, the 3.3 V power supply is a common power supply of the semiconductor integrated circuit. Other circuits in the semiconductor integrated circuit are also operated using the same 3.3 V power supply.

Figure 5:
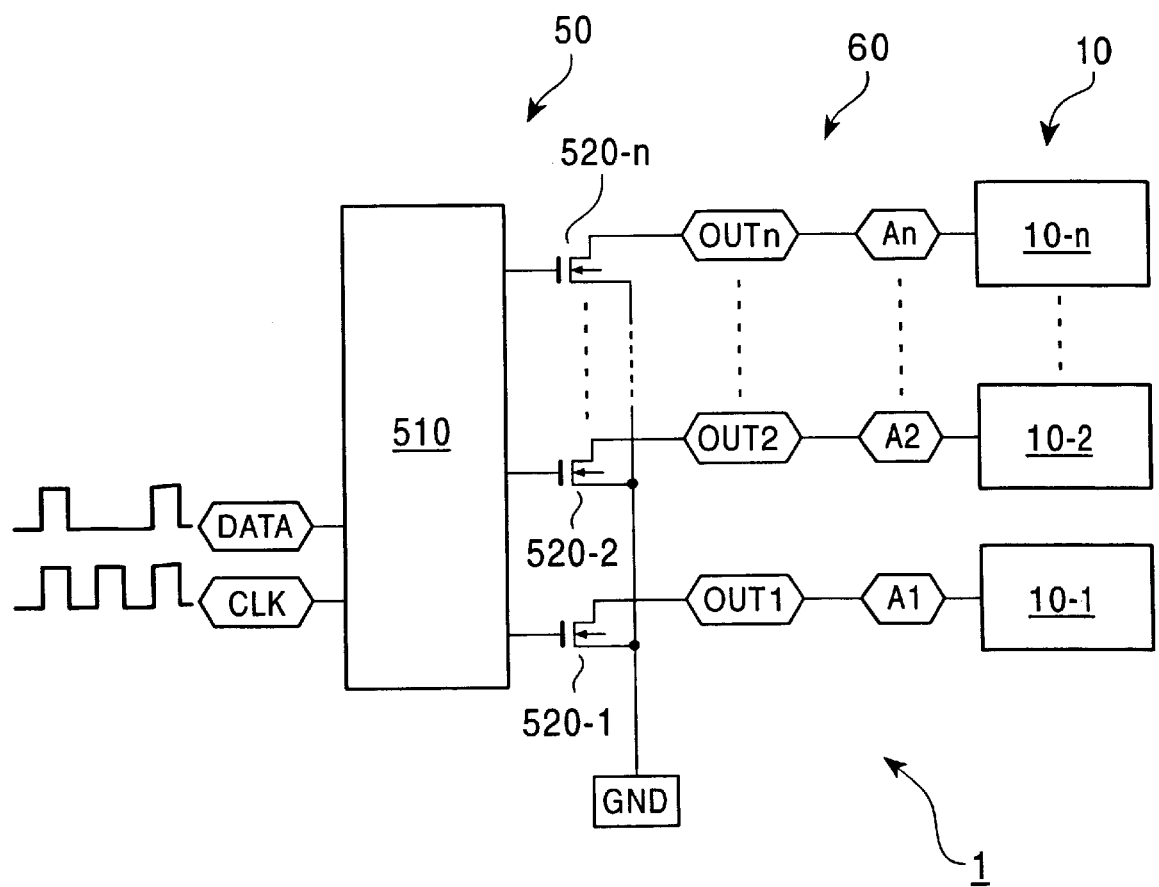
FIG. 5 is a block diagram of an n-bit memory circuit.

FIG. 5 is a block diagram showing a semiconductor integrated circuit 1 of the first embodiment. As shown in FIG. 5, the necessary number (n) of the one-bit memory circuits 10-1 to 10-n, shown in FIG. 4, are combined with a selection circuit 50, and hence an n-bit memory circuit 60 is formed. The selection circuit 50 shown in FIG. 5 includes a shift register 510 and buffers. The shift register 510 sequentially selects output terminals OUT1 to OUTn in accordance with a clock signal input to a clock input terminal CLK. The shift resistor 510 outputs data signals, which are input to a data input terminal DATA in synchronization with the clock signal, to the selected output terminal OUT1 to OUTn. The output terminals OUT1 to OUTn of the shift register 510 are provided with, for example, a buffer including NMOS transistors 520-1 to 520-n.

The selection circuit 50 operates with the 3.3 V power supply common to that of the reading circuit.

The selection circuit 50 and the high-voltage application circuits 200 in the n one-bit memory circuits 10-1 to 10-n are combined to form an n-bit writing circuit. That is, the high voltage (writing voltage) is applied to selected ones of the anti-fuse NMOS transistors 100 provided for each of the n bits, and the selected anti-fuse NMOS transistors 100 are broken and becomes conductive. Thereby, the n-bit data is written in the semiconductor integrated circuit having the n-bit memory circuit 60.

The NMOS and PMOS transistors forming the selection circuit 50, the PMOS transistor forming the high-voltage application circuit 200, and the NMOS and PMOS transistors forming the reading circuit 300 each have a relatively high drain-source breakdown voltage of approximately 15 V.

The operation of the one-bit memory circuit 10, including the method of writing data in the semiconductor integrated circuit according to the first embodiment of this invention will be described.

In the writing mode, a high voltage (writing voltage) is supplied to the VDD1 terminal. The writing voltage is higher than the drain-source breakdown voltage of the anti-fuse NMOS transistor 100. However, the writing voltage is lower than the breakdown voltage of the higher breakdown voltage NMOS transistor. For example, 10 V may be selected as the writing voltage.

When the corresponding output terminal of the shift register 510 shown in FIG. 5 outputs a signal representing logical "0", VDD1 potential is applied through the resistor 2001 to the gate of the PMOS transistor 201 of the high-voltage application circuit 200. And the PMOS 201 enters in an OFF state. The high voltage, which is supposed to be supplied from the writing power supply connected to the VDD1 terminal, is not supplied to the anti-fuse NMOS transistor 100. Thus, the anti-fuse NMOS transistor 100 is not broken i.e., remains non-conductive.

In contrast, when the corresponding output terminal of the shift register 510 outputs a signal representing logical "1", logical "0" is input to the input terminal A through the buffer. As a result, the PMOS transistor 201 of the high-voltage application circuit 200 enters in an ON state. The writing voltage of 10 V is supplied from the writing power supply between the drain and the source of the anti-fuse NMOS transistor 100 through the PMOS transistor 201. Thus, the NMOS transistor is broken and becomes conductive. The actual voltage applied between the drain and source of the anti-fuse NMOS transistor 100 is limited to the breakdown voltage of the anti-fuse NMOS transistor.

That is, the writing voltage is the voltage supplied from the writing power supply. The voltage actually applied between the drain and the source of the anti-fuse NMOS transistor 100 is lower than the writing voltage because of voltage drops in, for example, the PMOS transistor 201 through which the writing voltage is supplied to the anti-fuse NMOS transistor 100.

Because the breakdown voltage of each of the NMOS and PMOS transistors of the selection circuit 50 and the high-voltage application circuit 200 are higher than the 10 V writing voltage, the NMOS and PMOS transistors other than the anti-fuse NMOS transistor 100 will never be caused to breakdown. Even though the writing voltage is not directly supplied to the each transistor in these circuits, they are formed on the surface of the same semiconductor substrate and located near the anti-fuse NMOS transistor 100 to which the writing voltage is supplied. Therefore, these transistors may be damaged if the writing voltage is equal to or higher than the breakdown voltage of these transistors.

It is preferable that the breakdown voltage of the higher breakdown voltage NMOS transistor is at least 2 V higher than the writing voltage. However, more preferably, the breakdown voltage of the higher breakdown voltage NMOS transistor is at least 3 V, and most preferably, at least 4 V higher than the writing voltage.

At the same time, the writing voltage should be sufficiently higher than the breakdown voltage of the anti-fuse MOS transistor in order to reliably write the data. For example, the writing voltage is preferably at least 2 V higher than the breakdown voltage of the anti-fuse NMOS transistor. However, more preferably, the breakdown voltage is at least 3 V, and most preferably, at least 4 V higher than the breakdown voltage of the anti-fuse NMOS transistor.

The difference between the breakdown voltages of the higher breakdown voltage and the lower breakdown voltage transistors should be sufficiently large in order to reliably break the lower breakdown voltage transistors without damaging the higher breakdown voltage transistors. For example, the breakdown voltage of the higher breakdown voltage transistor is preferably at least 3 V higher than the breakdown voltage of the lower breakdown voltage transistor. However, more preferably, the breakdown voltage of the higher breakdown voltage transistor is preferably at least 5 V, and most preferably, at least 7 V higher than the breakdown voltage of the lower breakdown voltage transistor. As explained above, in the two-types of NMOS transistors fabricated by the method according to the first embodiment, the difference is as large as about 7 V. It is possible to further increase the difference by increasing the dose of the second boron implantation step. For example, if the dose is increased to $2.5 \times 10^{14}$ cm$^{-2}$ (the total dose of the first and the second steps of $3.1 \times 10^{14}$ cm$^{-2}$) the breakdown voltage of the lower breakdown voltage transistor reaches to approximately 6 V. Thus, the difference becomes to about 9 V.

When the PN junction between the drain and the channel of the anti-fuse NMOS transistor 100 is broken, the resistance between the drain and source of the NMOS 100 is reduced, and the NMOS 100 becomes conductive. The time required to supply the high voltage to cause the NMOS 100 to be conductive is less than or equal to a few milliseconds. The electric current of the writing power supply required to make the NMOS 100 conductive is approximately a few tens of milliamperes. This current is sufficient to form the conductive filament and sufficiently lower the resistance of the broken NMOS transistor.

When in the reading mode, the input terminal A is kept at floating. When the anti-fuse NMOS transistor 100 is broken and its resistance is reduced, the node 3101 becomes an "L" level, and an "H" level signal is output to the output terminal OUT. In contrast, when the anti-fuse NMOS transistor 100 is not broken and the resistance remains high, the node 3101 remains at an "H" level, and an "L" level signal is output to the output terminal OUT.

The permissive maximum drain-source resistance of the written anti-fuse NMOS transistor depends on the sensitivity of the reading circuit. When the conductive filament is formed, however, the resistance usually drops to about 100 ohms or smaller.

The read signal is used to drive a switching element for determining connection/non-connection of a resistor element, a capacitor element, or other circuit elements. Accordingly, circuit parameters of internal circuits included in the integrated circuit are determined, and the desired circuit operation of the semiconductor integrated circuit can be achieved. In other words, the operation of the programmed semiconductor integrated circuit, in which the data is written, is determined by whether the respective anti-fuse NMOS transistors are conductive or non-conductive.

Note that, the anti-fuse MOS transistor 100 fabricated by the method explained with reference to FIGS. 2A to 2E is made to be used exclusively as an anti-fuse. Therefore, other circuits in the semiconductor integrated circuit including the writing circuit, the reading circuit, and the internal circuits are constructed with the higher breakdown voltage NMOS transistors and PMOS transistors. Additionally, the internal circuit may use different NMOS and PMOS transistors fabricated with another process for operation with a lower power supply voltage.

In the circuit shown in FIG. 4, the gate of the anti-fuse NMOS transistor 100 is connected to the source through the resistor 1001, and the NMOS transistor 100 is kept in Off state. That is, the writing voltage is supplied between the drain and the source to break the NMOS 100 when the NMOS 100 is in an OFF state. As previously explained, U.S. Pat. No. 5,019,878 suggests to apply a gate voltage higher than the threshold voltage in order to reduce the drain voltage necessary to break the NMOS transistor. However, this method is not used.

The anti-fuse NMOS transistor 100 according to this embodiment has lower breakdown voltage and can be broken with lower writing voltage without applying the gate voltage. In addition, when the p-type impurity concentration is also increased in the center portion of the channel region, the threshold voltage of the anti-fuse NMOS transistor 100 is higher than the threshold voltage of the first NMOS transistor. As a result, a higher gate voltage is required to decrease the necessary writing voltage. In fact, the threshold voltage of the anti-fuse NMOS transistor is higher than the 3.3 V power supply voltage of the semiconductor integrated circuit when the second boron implantation is made at the acceleration voltage of 40 keV through the 100 nm thick silicon nitride film 150. Therefore, it is difficult to apply a gate voltage effective to decrease the writing voltage.

As shown in FIG. 1, the MOS transistor has a single drain structure, which does not have a lightly-doped drain (LDD) region, is used as an anti-fuse. Although a MOS transistor with an LDD structure can be used as an anti-fuse, the single drain structure is preferable for reducing the breakdown voltage.

The semiconductor integrated circuit having the NMOS with a low breakdown voltage and the fabrication method thereof have been described in the first embodiment. The first embodiment is also applicable to an integrated circuit having a PMOS with a low breakdown voltage and a fabrication method thereof.

In the high voltage application circuit 200, the PMOS transistor 201 is used as a switch to determine whether to supply or not supply the writing voltage to the anti-fuse NMOS transistor 100. Other elements such as an NMOS transistor can also be used as a switch. Similarly, various modifications may be made in the selection circuit 50 and the reading circuit 20.

As described above, according to the semiconductor integrated circuit of the first embodiment, the PN junction between the drain and the channel of the anti-fuse MOS transistor can be broken without damaging other elements.

According to the semiconductor integrated circuit fabrication method of the first embodiment, the semiconductor integrated circuit can be fabricated by only adding a few steps to a conventional fabrication method.

Next, a semiconductor integrated circuit according to the second embodiment of this invention and a method for writing data in the semiconductor integrated circuit is described. Referring to FIGS. 6A to 6E, a method of fabricating a diode, which is used as an anti-fuse in the semiconductor integrated circuit of the second embodiment, will now be described.

FIGS. 6A to 6E are sectional views showing a step-by-step process of fabricating the diode contained in the semiconductor integrated circuit of the second embodiment.

Figure 6A:
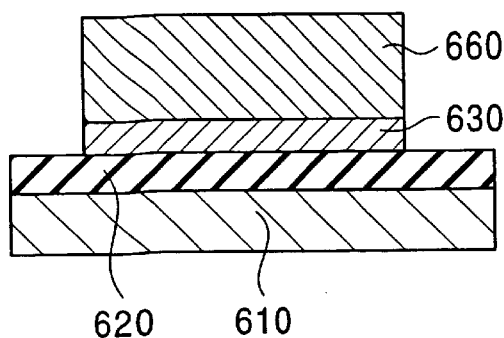
FIGS. 6A to 6E are sectional views showing a step-by-step process for fabricating a diode included in a semiconductor integrated circuit according to a second embodiment of this invention.

On a single-crystalline silicon substrate 610 shown in FIG. 6A, a thermal oxide film 620 functioning as an insulating film is formed. On the thermal oxide film 620, a patterned polysilicon film 630 is formed. In practice, a polysilicon film is deposited on the entire surface of the oxide film 620 and pattered in a desired pattern using a resist mask 660. In the plane view, the patterned polysilicon film 630 has, for example, a rectangular shape with a width, i.e., a dimension in a direction perpendicular to the sectioned surface of FIG. 6, of about 8.0 μm. The thickness of the polysilicon film is, for example, 265 nm.

Figure 6D:
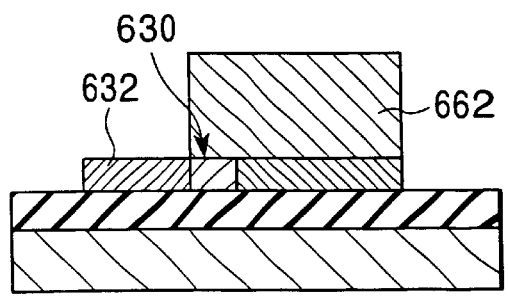
Figure 6B:
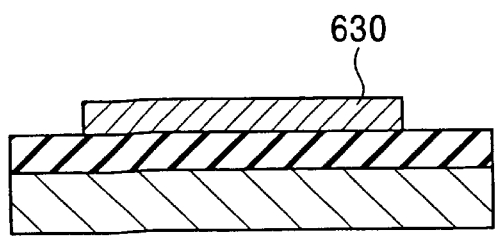

An n-type impurity such as phosphorous is doped by an implantation into the patterned polysilicon film 630 at a dose of $1 \times 10^{15}$ cm$^{-2}$. As shown in FIG. 6B, the entire patterned polysilicon film 630 becomes an n region. Alternatively, the doping can be made before the patterning of the polysilicon film.

Figure 6E:
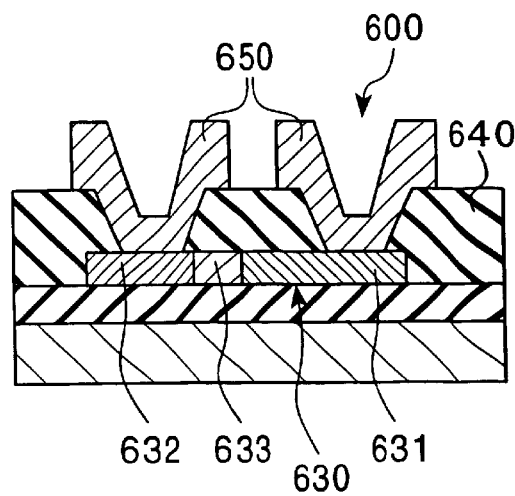
Figure 6C:
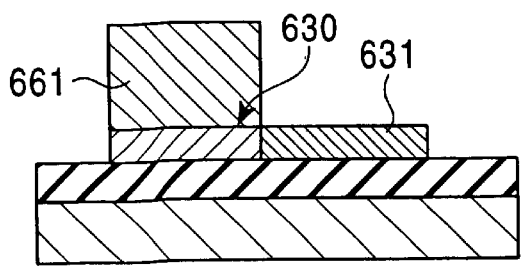

Referring to FIG. 6C, a resist mask 661 is formed to cover the left half of the patterned polysilicon film 630, whereas the right half is heavily doped with a p-type impurity such as boron. As a result, a p$^+$ diffusion region 631 shown in FIG. 6C is formed.

In order to form an contact region, a resist mask 662 having an aperture at the left end of the patterned polysilicon film 630 is formed, and this portion is heavily doped with a n type impurity such as phosphorous or arsenic by an ion implantation. As a result, an n$^+$ diffusion region 632 is formed, as shown in FIG. 6D.

An interlayer dielectric film 640 is formed so as to cover the patterned polysilicon film 630. Contact holes are formed in the interlayer dielectric film 640. Electrodes 650 are formed to connect to the p$^+$ region 631 and the n$^+$ region 632 using, for example, an aluminum alloy film, and hence a diode 600 shown in FIG. 6E is produced. In the diode 600 shown in FIG. 6E, a PN junction is formed between the p$^+$ region 631 and the n$^-$ region 633 into which phosphorous is implanted at a dose of $1 \times 10^{15}$ cm$^{-2}$. The electrode 650 to the p$^+$ region 631 is an anode electrode and the electrode 650 to the n$^+$ region 632 is a cathode electrode.

Figure 7:
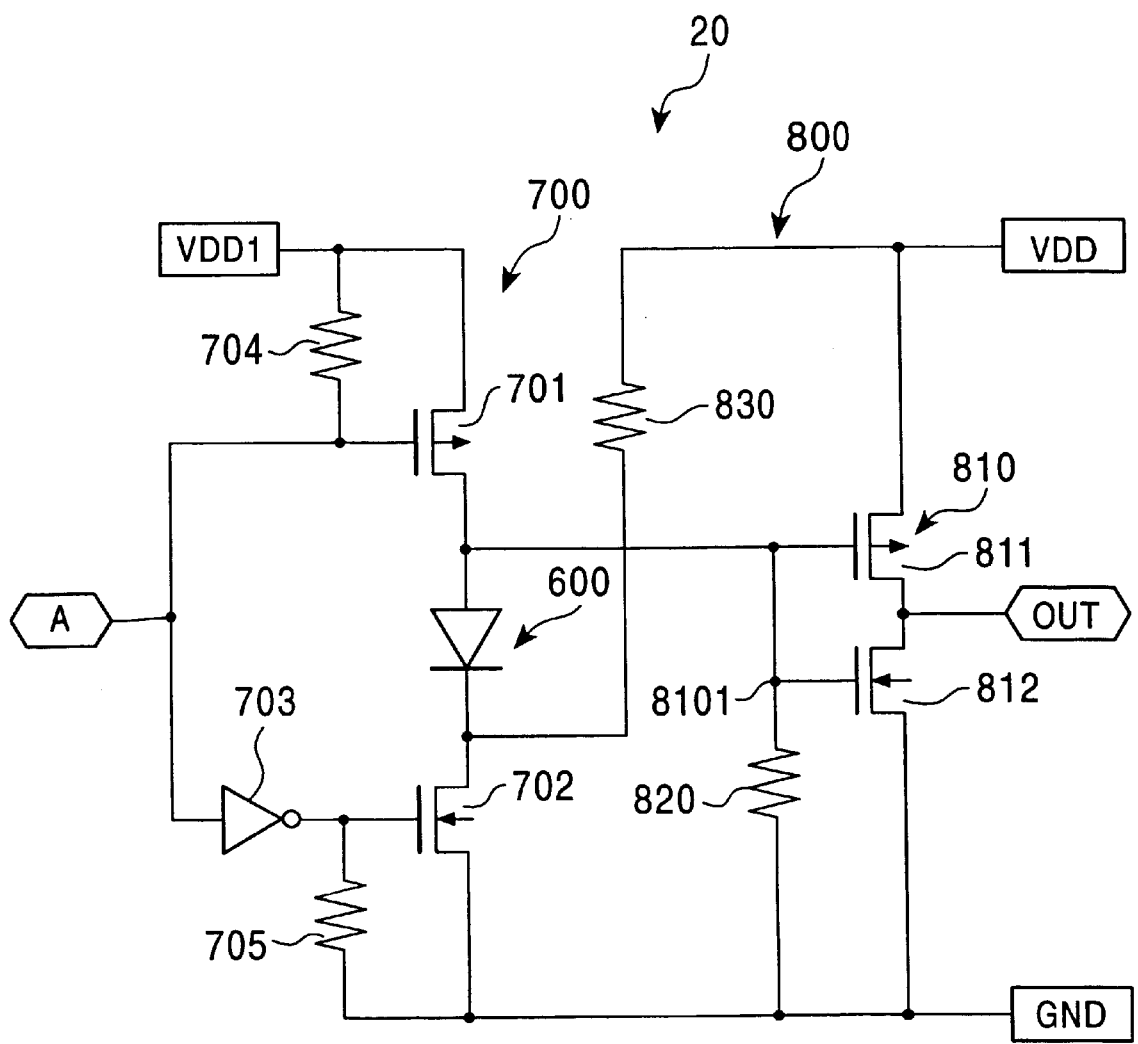
FIG. 7 is a circuit diagram of a second one-bit memory circuit.

The semiconductor integrated circuit of the second embodiment has a plurality of one-bit memory circuits each has the diode 600. Referring to FIG. 7, the one-bit memory circuit will now be described.

FIG. 7 is a circuit diagram of the one-bit memory circuit. The one-bit memory circuit 20 shown in FIG. 7 contains the diode 600 shown in FIG. 6E, a high-voltage application circuit 700, and a reading circuit 800.

The high-voltage application circuit 700 includes a PMOS transistor 701 and an NMOS transistor 702. The PMOS transistor 701 and the NMOS transistor 702 are arranged between VDD1 terminal and the ground GND. The source of the PMOS transistor 701 is connected to the VDD1 terminal, and the source of the NMOS transistor 702 is connected to the ground GND. The VDD1 terminal is connected to an external 10 V writing power supply when writing data. The gate of the PMOS transistor 701 is connected to the input terminal A. The gate of the NMOS transistor 702 is connected to the input terminal A through an inverter 703. Data to be written is input to the input terminal A. A resistor 704 for voltage adjustment is provided between the VDD1 terminal and the input terminal A. A resistor 705 for voltage adjustment is provided between the ground GND and the gate of the NMOS transistor 702.

The diode 600 with the PN junction between the p$^+$ region and the n$^-$ region functions as an anti-fuse in the one-bit memory circuit 20. According to data input to the input terminal A, the PN junction is broken (written) or not broken (not written) by the high-voltage application circuit 700. The diode 600 is connected between the PMOS transistor 701 and the NMOS transistor 702 of the high-voltage application circuit 700 so that the p$^+$ region side (anode) is positioned at the VDD1 side and that the n$^-$ region side (cathode) is positioned at the ground GND side. An electric current flowing from the VDD1 terminal to the ground GND is a forward current for the diode 600, whereas an electric current from the ground GND to the VDD1 terminal is a reverse current for the diode 600.

The reading circuit 800 has an inverter 810 formed by a PMOS 811 transistor and an NMOS transistor 812. The output of the inverter 810 is connected to output terminal OUT. A node 8101 between the gate of the PMOS transistor 811 and the gate of the NMOS transistor 812 is connected to the node between the PMOS transistor 701 of the high-voltage application circuit 700 and the anode of the diode 600. A first resistor 820 is connected between the node 8101 and the ground GND. A second resistor 830 is connected between the power supply terminal VDD and the node between the cathode of the diode 600 and the NMOS transistor 702 of the high-voltage application circuit 700. The resistance of the second resistor 830 is much lower than that of the reverse biased diode 600, which is not broken, and is much higher than that of the first resistor 820. The power supply terminal VDD is connected to a 3.3 V power supply for the reading circuit 800.

Figure 8:
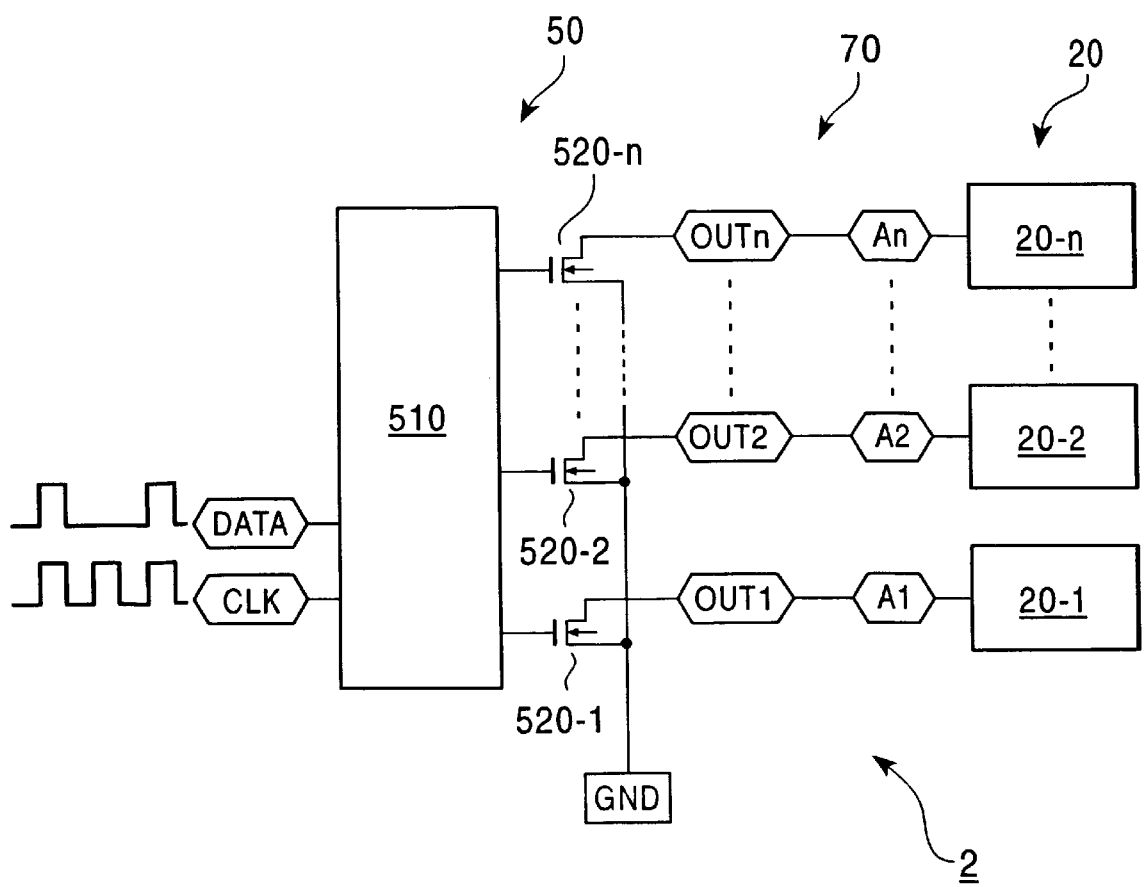
FIG. 8 is a block diagram of a second n-bit memory circuit.

FIG. 8 is a block diagram of a semiconductor integrated circuit 2 of the second embodiment. As shown in FIG. 8, a necessary number (n) of one-bit memory circuits 20-1 to 20-n, shown in FIG. 7, are combined with the selection circuit 50, and hence an n-bit memory circuit 70 is formed. The selection circuit 50 is similar to that shown in FIG. 5, and operates with the 3.3 V power supply voltage common to that of the reading circuit.

The selection circuit 50 and the high-voltage application circuits 700 in the n one-bit memory circuits 20-1 to 20-n are combined to form an n-bit writing circuit. That is, the combination of the selection circuit 50 and n high-voltage application circuits 700, supplies the high voltage (writing voltage) to selected ones of the n anti-fuse diodes 600. Accordingly, n-bit data is written.

The NMOS transistors and PMOS transistor forming the selection circuit 50, the high-voltage application circuit 700, and the reading circuit 800 are formed on the surface of the semiconductor substrate, over which the anti-fuse diodes 600 are formed. The PN junctions of the NMOS and PMOS 701 transistors included in the high-voltage application circuit 700, selection circuit 50, the reading circuit 800 each has a breakdown voltage of approximately 12 V.

The operation of the one-bit memory circuit 20, including a method of writing data in the semiconductor integrated circuit and a method of reading data according to the second embodiment of this invention will now be described with reference-to the one-bit memory circuit 20 shown in FIG. 7.

In data writing, a forward current flowing through the anti-fuse diode 600 is employed. When a logical "0" signal is output from the corresponding output terminal of the shift register 510 shown in FIG. 8, VDD1 potential is applied through the resistor 704 to the gate of the PMOS 701 transistor of the high-voltage application circuit 700. Then, the PMOS transistor 701 enters an OFF state. A writing voltage, which is supposed to be supplied from the writing power supply, to which the VDD1 terminal is connected, is not supplied to the diode 600. Hence, the diode 600 is not broken.

In contrast, when a logical "1" signal is output from the corresponding output terminal of the shift register 510, a logical "0" is input to the input terminal A. As a result, the PMOS transistor 701 of the high-voltage application circuit 700 enters an ON state. Also, the NMOS transistor 702 of the high-voltage application circuit 700 enters an ON state. As a result, the 10 V writing voltage is supplied from the writing power supply to the anti-fuse diode 600 in the forward direction through the PMOS transistor 701 and the NMOS transistor 702. The breakdown voltage of the diode limits an actual voltage applied between the anode and the cathode electrodes of the diode 600. The diode is forward-biased and a forward current of 10 to 20 mA is caused to flow through the PN junction of the diode 600 for approximately 10 ms.

As a result, aluminum diffuses from the aluminum electrode 650 contacting the $n^+$ region 632 shown in FIG. 6E through the patterned polysilicon film and reaches the aluminum electrode 650 contacting the $p^+$ region 631. The PN junction of the diode 600 is shorted by the conductive filament made by the diffused aluminum. In both forward and reverse directions, the diode 600 becomes conductive and the resistance of the diode becomes permanently low. That is, the diode that is made to be conductive by applying the forward breakdown voltage has a low resistance in both directions.

Since breakdown voltages of the PMOS transistor 701 and the NMOS transistor 702 of the high-voltage application circuit 700 are higher than the writing voltage, they are prevented from breaking down.

In data reading, the input terminal A is floated, and the resistance of the reverse-biased diode 600 is detected. Specifically, a reverse bias is applied to the diode 600 through the second resistor 830 connected to the VDD terminal and the first resistor 820 connected to the GND terminal, and the resistance of the diode 600 under the reverse bias is detected. If the PN junction of the anti-fuse diode 600 has been broken and thus the resistance is low, the voltage from the reading power supply to which the VDD terminal is connected hardly drops at the diode 600 and is applied to the node 8101. As a result, the node 8101 becomes an "H" level, and an "L" level signal is output to the output terminal OUT. In contrast, if the PN junction of the diode 600 has not been broken and thus the resistance of the reverse-biased diode 600 remains high, the potential at the node 8101 becomes GND, that is, "L" level. As a result, an "H" level signal is output to the output terminal OUT.

The read signal is used to drive a switching element for determining connection/non-connection of a resistor element, a capacitor element, or other circuit elements.

Accordingly, circuit parameters of internal circuits included in the integrated circuit are determined, and the desired circuit operation of the semiconductor integrated circuit can be achieved. That is, the semiconductor integrated circuit is programmed by i) providing a plurality of anti-fuse diodes in the integrated circuit, ii) making selected ones of the anti-fuse diodes conductive by supplying a writing voltage to the selected ones in the forward direction, iii) detecting whether respective anti-fuse diodes are conductive or not conductive under a reverse bias, and iv) determining the circuit parameters of internal circuits of the integrated circuit according to the result of the detection.

Figure 9:
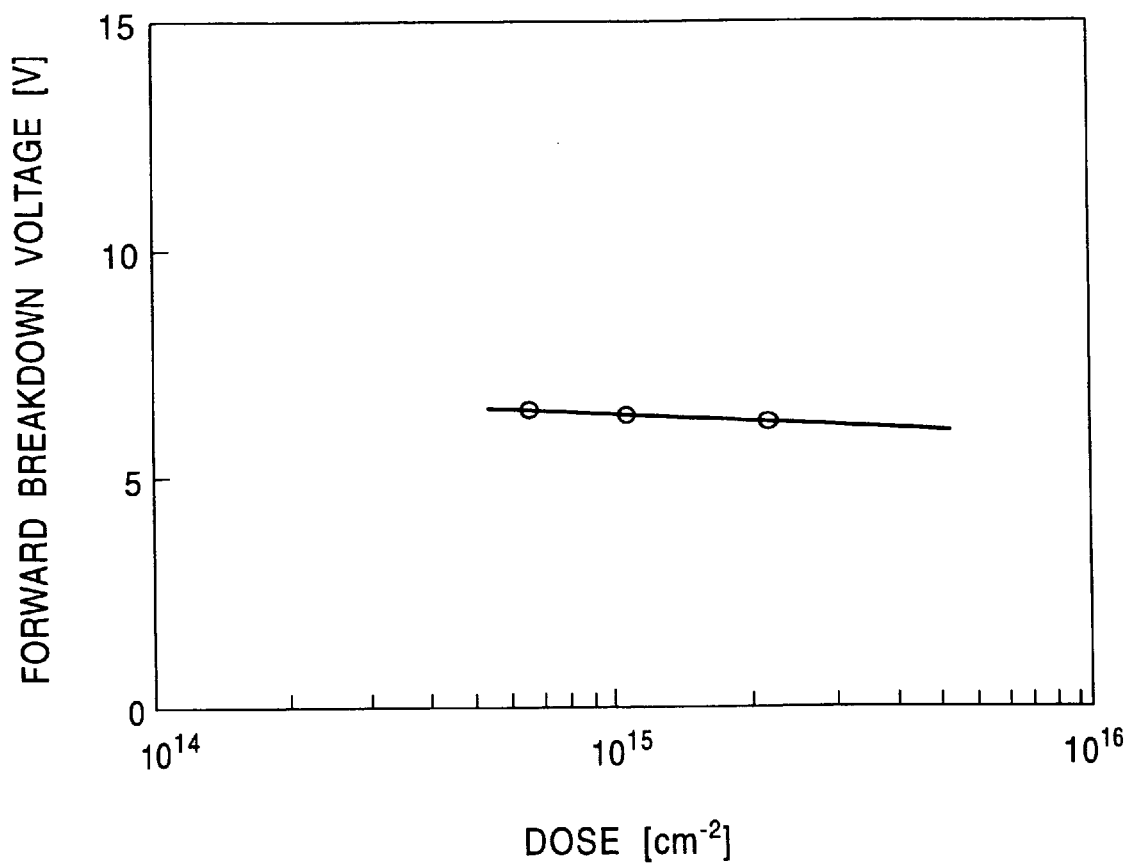
FIG. 9 is a graph showing a relationship between the dose of phosphorous implanted into the polysilicon film and the breakdown voltage of the forward-biased PN junction.
Figure 10:
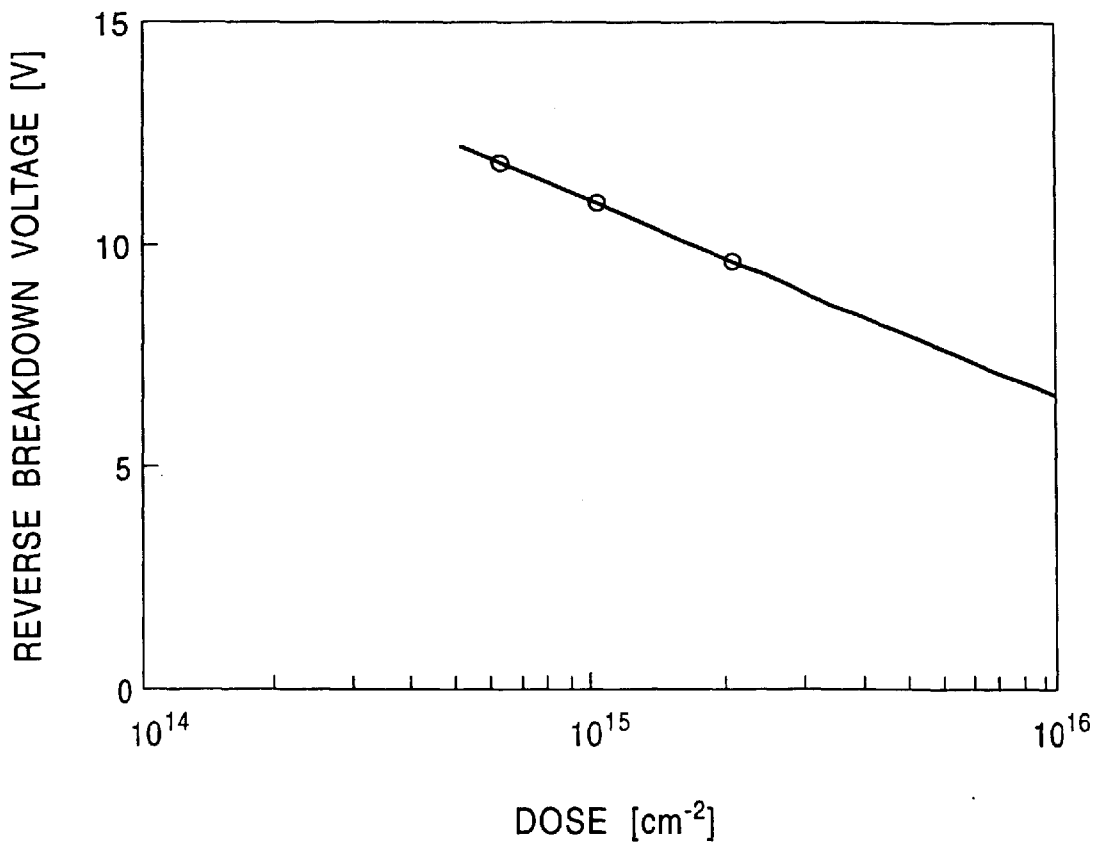
FIG. 10 is a graph showing the relationship between a dose of phosphorous implanted into the polysilicon film and the breakdown voltage of the reverse-biased PN junction.

Referring to FIGS. 9 and 10, effects on the phosphorus implantation dose into the polysilicon film 830 shown in FIG. 6A will now be described.

FIG. 9 is a graph showing the relationship between the phosphorous implantation dose into the polysilicon film 630 and the breakdown voltage of the forward-biased PN junction. FIG. 10 is a graph showing the relationship between the phosphorous implantation dose into the polysilicon film 630 and the breakdown voltage of the reverse-biased PN junction.

In each of the graphs, the horizontal axis is a logarithmic axis and represents the dose ($cm^{-2}$) of phosphorous implantation shown in FIG. 6A. The vertical axis represents the breakdown voltage (V) of the PN junction required to form the conductive filament and cause the anti-fuse diode conductive in both directions.

Referring to FIG. 9, when causing the PN junction to break down by applying the forward voltage, the breakdown voltage is not significantly influenced by the phosphorous dose. Applying a voltage of 6 V to 7 V, not relying on the dose, can break the PN junction. The PN junction of the diode 600 contained in the semiconductor integrated circuit 2 of the second embodiment has a junction between the $p^+$ region 631 and the $n^-$ region 633 into which phosphorous is implanted at a dose of $1 \times 10^{15}$ $cm^{-2}$. Thus, when causing the PN junction to break down and make conductive by the application of a forward bias, as shown in FIG. 9, it is only necessary to apply a voltage of 6.5 V.

In contrast, when causing the PN junction to break down by the application of a reverse bias, as shown in FIG. 10, it is necessary to apply a voltage of 12 V In this case, the PN junctions of the PMOS transistor 701 and the NMOS transistor 702 of the high-voltage application circuit 700 shown in FIG. 7 may also be caused to break down. In order the lower the necessary writing voltage to 6.5 V in the reverse bias breakdown, which is the same as the forward bias case, as shown in FIG. 10, it is necessary to increase the dosage of phosphorous to $1 \times 10^{16}$ $cm^{-2}$.

Figure 11:
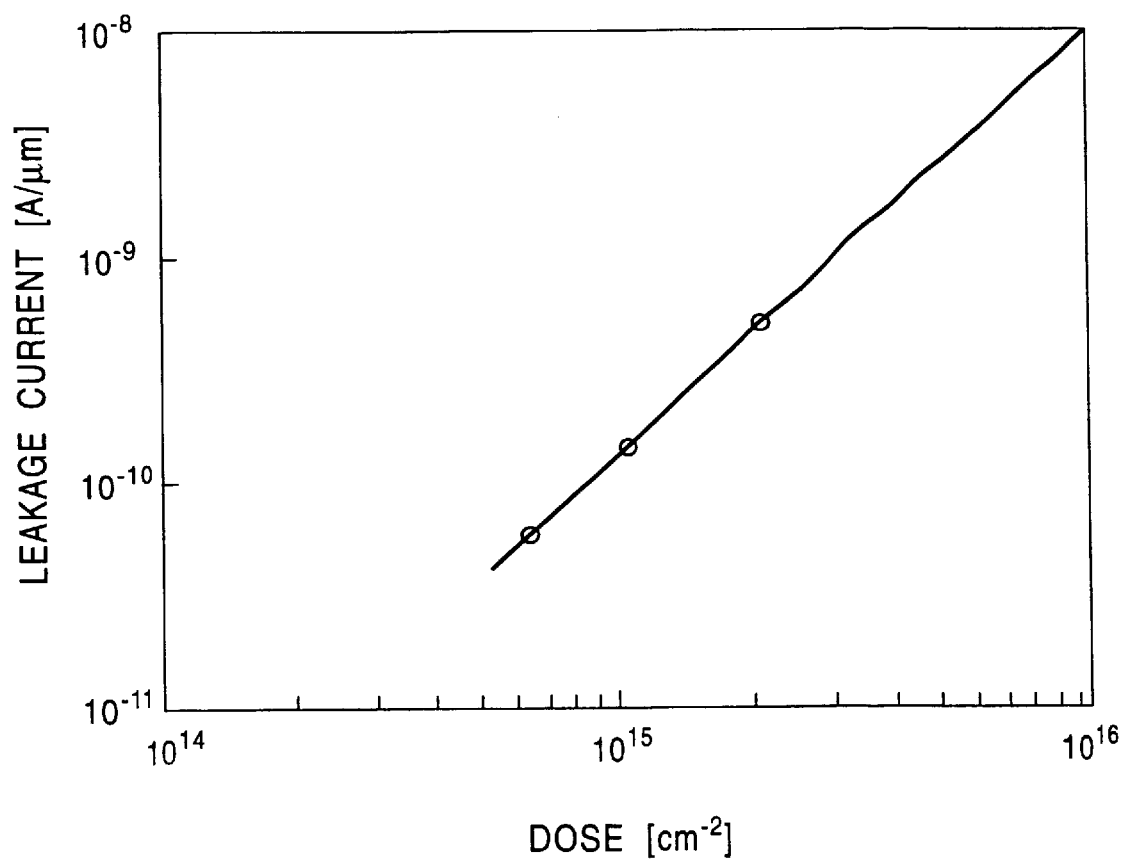
FIG. 11 is a graph showing the relationship between a dose of phosphorous implanted into the polysilicon film and the leakage current density of the PN junction.

Referring to FIG. 11, the relationship between the phosphorus dose and the leakage current from the PN junction will now be described.

FIG. 11 is a graph showing the relationship between the phosphorous implantation dose into the polysilicon film 630 and the reverse leakage current of the PN junction. Both horizontal and vertical axes are logarithmic axes. The horizontal axis represents the dose ($cm^{-2}$) of phosphorous implanted into the polysilicon film 630 shown in FIG. 6A, and the vertical axis represents the reverse leakage current per unit length (A/$\mu$m) of the PN junction when a reverse bias voltage of 3.3 V is applied.

In the semiconductor integrated circuit 2 of the second embodiment, a reverse voltage is applied to the PN junction of the diode 600 in order to detect whether the anti-fuse diode 600 is conductive or non-conductive. When the PN junction is not broken, the diode 600 is non-conductive and the current hardly flows. Actually, however, the leakage current shown in FIG. 11 flows.

In order to break the PN junction by the application of a reverse bias voltage of 6.5 V, it is necessary to implant phosphorous at a dose of $1 \times 10^{16}$ cm$^{-2}$. With this dose, as shown in FIG. 11, the leakage current reaches $1 \times 10^{-8}$ A/$\mu$m. In contrast, in the semiconductor integrated circuit 2 according to the second embodiment in which the phosphorus dose is only $1 \times 10^{15}$ cm$^{-2}$, as shown in FIG. 11, the leakage current is reduced to $2 \times 10^{10}$ A/$\mu$m.

In the semiconductor integrated circuit 2 of the second embodiment, the leakage current can be reduced, and a power consumption when reading data can be suppressed. When the diode 600 is in the non-conductive state, it can be ensured that the potential detected at the node 8101 is at an L level even when a sensitivity of the reading circuit is not very high.

Generally, the leakage current should preferably below $1 \times 10^{-9}$ A/$\mu$m. Therefore, phosphorous implantation dose should preferably be less than about $3 \times 10^{15}$ cm$^{-2}$. Because the thickness of the polysilicon film is 265 nm, the implantation doses of $1 \times 10^{15}$ cm$^{-2}$ and $3 \times 10^{15}$ $^{cm-2}$ yields dopant concentrations in the polysilicon film of about $3.8 \times 10^{19}$ cm$^{-3}$ and about $1.1 \times 10^{20}$ cm$^{-3}$, respectively. Generally, the dopant concentration in the polysilicon film should preferably be less than about $1 \times 10^{20}$ cm$^{-3}$, more preferably less than about $7 \times 10^{19}$ cm$^{-3}$, and most preferably less than about $4 \times 10^{19}$ cm$^{-3}$ to reduce the leakage current.

The polysilicon film 630 doped with phosphorous at a dose of $1 \times 10^{15}$ cm$^{-2}$ has a sheet resistance of approximately 4000$\Omega$/□, which is at the same level as that of a polysilicon film generally used as resister elements in a semiconductor integrated circuit. Therefore, the phosphorus implantation to form the n$^-$ region 630 of the anti-fuse diode 600 can be made simultaneously with the phosphorous implantation into a polysilicon film used to form resistor elements. In other words, the anti-fuse diode and the resistor element can be formed using respective pattern polysilicon films formed from a same polysilicon film into which phosphorous, or other impurities, is lightly doped by the same process step.

Accordingly, in the method of fabrication the semiconductor integrated circuit having the anti-fuse diode and the resistor element, the number of required process steps can be reduced. That is, a polysilicon film is formed over a surface of a semiconductor substrate and patterned to form a first and a second pattered polysilicon film each for the anti-fuse diode and the resistor element. The patterned polysilicon films are simultaneously doped lightly with phosphorus or other dopants prior to or after the patterning. Heavily-doped p$^+$ and n$^+$ regions are formed on either side of the lightly-doped region of the first patterned polysilicon film to form the anti-fuse diode. On the other hand, p$^+$ or n$^+$ heavily-doped regions are formed on both sides of the lightly-doped region of the second patterned polysilicon film to form the resistor element. Formation of one of the heavily-doped regions of the anti-fuse diode can be made simultaneously with the formation of heavily-doped regions of the resistor element of the same conductivity type.

In the fabricated semiconductor integrated circuit, the anti-fuse diode and the resistor element are formed in respective patterned polysilicon films having the same thickness. The anti-fuse diode and the resistor element have lightly-doped regions with the same dopant concentration. In the anti-fuse diode, p$^+$ and n$^+$0 heavily-doped regions are formed on either side of the lightly-doped region. In the resister element, p$^+$ or n$^+$ heavily-doped regions are formed on both sides of the lightly-doped region.

An example in which the PN junction is formed in the polysilicon film 630 has been described. Specifically, a PN junction that divides the patterned polysilicon film in a direction parallel to the surface of the semiconductor substrate, or a laterally direction, is formed. The current of the diode flows in the patterned polysilicon film in the lateral direction through the PN junction. This type of polysilicon diode is advantageous as an anti-fuse, because the conductive filament can be formed at relatively small amount of current. However, other types of diode having a PN junction can be used as an anti-fuse.

The p-n junction between a p$^+$ region and an n$^-$ region can also be formed in the surface of the single crystalline silicon substrate 610. The forward bias breakdown voltage of approximately 6 V to 7 V, which is lower than the reverse bias breakdown voltage, can be also realized in this case. However, the current required to break the PN junction and to form a conductive filament in the diode formed on the single crystalline silicon substrate 610 is higher, namely, 100 mA to 200 mA.

Although the diode having the PN junction between the p$^+$ region and the n$^-$ region has been described as an example in the above description, the polarity can be inverted, and the PN junction between a p$^-$ region and an n$^+$ region can be used.

As described above, the n$^-$ region having a relatively low dopant concentration is advantageously provided between the p$^+$ and n$^+$ regions of the p$^+$-n$^-$-n$^+$ diode to minimize the leakage current. The p$^-$ region in the p$^+$-p$^-$-n$^+$ diode has the same effect. However, the length of the n$^-$ or p$^-$ region, or the separation between the p$^+$ and n$^+$ regions should not be too large in order to minimize the current necessary to form the conductive filament in the anti-fuse diode. Preferably, the length should be less than about 2 $\mu$m. Similarly, the separation between the PN junction and the anode or cathode contact should not be too large in order to minimize the current necessary to form the conductive filament. Preferably, the separation should be less than about 2.2 $\mu$m. Further, the number of contact to the p$^+$ and n$^+$ regions should be minimized to reduce the current necessary to make the anti-fuse diode conductive. Typically, only one contact is provided for each of the p$^+$ and n$^+$ regions.

As described above, according to the method of writing in the second embodiment, the voltage applied to break the PN junction and to make the diode conductive can be sufficiently reduced. Also, a low breakdown voltage and a low leakage current can be achieved at the same time. The semiconductor integrated circuit according to the second embodiment requires low writing voltage and consumes small power when reading.

What is claimed is:

1. A semiconductor integrated circuit comprising:
   a semiconductor substrate having a surface;
   a MOS transistor formed on the surface of the semiconductor substrate, the MOS transistor comprising a first conductivity type source and drain regions and a second conductivity type channel region between the source and the drain regions, the MOS transistor having a first breakdown voltage between the drain and the source regions;
   an anti-fuse device formed on the surface of the semiconductor substrate, the anti-fuse device comprising a pair of diffusion regions of the first conductivity type and a second region of the second conductivity type between the pair of diffusion regions, the anti-fuse device having a second breakdown voltage between the pair of diffusion regions lower than the first breakdown voltage; and a writing circuit integrated on the surface of the semiconductor substrate, the writing circuit supplying a writing voltage between the pair of diffusion regions of the anti-fuse device to make the anti-fuse device permanently conductive between the pair of diffusion regions.

2. The integrated circuit according to claim 1, wherein at least a portion of the second region of the anti-fuse device adjacent to one of the pair of diffusion regions includes an impurity of the second conductivity type with a concentration higher than that at a corresponding portion of the channel region of the MOS transistor.

3. The integrated circuit according to claim 1, wherein:
the second region of the anti-fuse device extends between two ends along opposing edges of the pair of diffusion regions; and
at least one of portions adjacent to the ends of the second region of the anti-fuse device includes an impurity of the second conductivity type with a first concentration higher than that at a first corresponding portion of the channel region of the MOS transistor.

4. The integrated circuit according to claim 3, wherein a center portion between the ends of the second region of the anti-fuse device includes the second conductivity type impurity with a second concentration higher than that at a second corresponding portion of the channel region of the MOS transistor.

5. The integrated circuit according to claim 2, wherein:
the MOS transistor is formed in a first surface region of the semiconductor substrate and the anti-fuse device is formed in a second surface region of the semiconductor substrate; and
the first and the second surface regions of the semiconductor substrate contain a substrate impurity of the second conductivity type with a same concentration.

6. The integrated circuit according to claim 1, wherein the writing circuit includes the MOS transistor.

7. The integrated circuit according to claim 2, wherein:
the MOS transistor is formed in a first well on the surface of the semiconductor substrate and the anti-fuse device is formed in a second well on the surface of the semiconductor substrate; and
the first and the second wells have a same impurity concentration.

8. The integrated circuit according to claim 1, wherein:
the MOS transistor is formed in a first well on the surface of the semiconductor substrate and the anti-fuse device is formed in a second well on the surface of the semiconductor substrate; and
the first and the second wells have a same impurity concentration.

9. The integrated circuit according to claim 8, further comprising an internal circuit, a circuit parameter of the internal circuit being determined by whether the anti-fuse device has been made to be permanently conductive between the pair of diffusion regions, the internal circuit including the MOS transistor.

10. A programmed semiconductor integrated circuit comprising:
a semiconductor substrate having a surface;
a plurality of MOS transistors formed on the surface of the semiconductor substrate, each of the MOS transistors comprising a first conductivity type source and drain regions and a second conductivity type channel region between the source and the drain regions;
a plurality of anti-fuse devices formed on the surface of the semiconductor substrate, each of the anti-fuse devices having a pair of diffusion regions of the first conductivity type and a second region of the second conductivity type between the pair of diffusion regions, wherein:
the MOS transistors have a first breakdown voltage between the drain and the source regions thereof and the anti-fuse devices have a second breakdown voltage between the pair of diffusion regions thereof lower than the first breakdown voltage; and
selected ones of the anti-fuse devices have conductive filaments that connect between the respective diffusion regions thereof.

11. The programmed integrated circuit according to claim 10, further comprising a writing circuit that supplies a writing voltage between the diffusion regions of the selected ones of the anti-fuse devices to form the conductive filaments, the writing circuit including at least one of the MOS transistors.

12. The programmed integrated circuit according to claim 10, further comprising an internal circuit, a circuit parameter of the internal circuit being determined by whether the respective anti-fuse devices have the conductive filaments, the internal circuit including at least one of the MOS transistors.

13. The programmed integrated circuit according to claim 10, wherein:
at least one of the MOS transistors is formed in a first well on the surface of the semiconductor substrate and at least one of the anti-fuse devices is formed in a second well on the surface of the semiconductor substrate; and
the first and the second wells have a same impurity concentration.

14. The programmed integrated circuit according to claim 13, further comprising an internal circuit, a circuit parameter of the internal circuit being determined by whether the respective anti-fuse devices have the conductive filaments, the internal circuit including at least one of the MOS transistors.

* * * * *